(12) United States Patent
Nakajima et al.

(10) Patent No.: US 9,087,889 B2
(45) Date of Patent: Jul. 21, 2015

(54) SEMICONDUCTOR DEVICES WITH 2DEG AND 2DHG

(75) Inventors: Akira Nakajima, Tsukuba (JP); Sankara Narayanan Ekkanath Madathil, Leicester (GB)

(73) Assignee: The University of Sheffield, Sheffield (GB)

( * ) Notice: Subject to any disclaimer, the term of this patent is extended or adjusted under 35 U.S.C. 154(b) by 0 days.

(21) Appl. No.: 13/812,725

(22) PCT Filed: Jun. 7, 2011

(86) PCT No.: PCT/GB2011/051065
§ 371 (c)(1),
(2), (4) Date: Mar. 26, 2013

(87) PCT Pub. No.: WO2012/013943
PCT Pub. Date: Feb. 2, 2012

(65) Prior Publication Data
US 2013/0221409 A1    Aug. 29, 2013

(30) Foreign Application Priority Data
Jul. 28, 2010    (GB) .................................. 1012622.5

(51) Int. Cl.
*H01L 29/778*    (2006.01)
*H01L 27/095*    (2006.01)
*H01L 29/10*    (2006.01)
(Continued)

(52) U.S. Cl.
CPC .......... *H01L 29/7782* (2013.01); *H01L 27/095* (2013.01); *H01L 29/1029* (2013.01); *H01L 29/42316* (2013.01); *H01L 29/7786* (2013.01); *H01L 29/7787* (2013.01); *H01L 29/782* (2013.01); *H01L 29/2003* (2013.01)

(58) Field of Classification Search
CPC .................................. H01I 21/00; H01I 29/10
See application file for complete search history.

(56) References Cited

U.S. PATENT DOCUMENTS

2004/0135169 A1    7/2004    Yoshii et al.
2006/0065908 A1    3/2006    Beach

FOREIGN PATENT DOCUMENTS

EP    0256360 A2    2/1988
EP    0305253 A1    1/1989
(Continued)

OTHER PUBLICATIONS

Ashok et al, Theoretical Evidence of Spontaneous Spin Polarization in GaAs/AlGaAs Split-Gate Heterostructures, 2004, IEEE, pp. 255 and 256.*

(Continued)

*Primary Examiner* — Fernando L Toledo
*Assistant Examiner* — Valerie N Newton
(74) *Attorney, Agent, or Firm* — Fraser Clemens Martin & Miller LLC; William J. Clemens

(57) ABSTRACT

A semiconductor device comprises three semiconductor layers. The semiconductor layers are arranged to form a 2DHG and a 2DEG separated by a polarization layer. The device comprises a plurality of electrodes: first and second electrodes electrically connected to the 2DHG so that current can flow between them via the 2DHG and a third electrode electrically connected to the 2DEG so that when a positive voltage is applied to the third electrode, with respect to at least one of the other electrodes, the 2DEG and the 2DHG will be at least partially depleted.

22 Claims, 17 Drawing Sheets

(51) Int. Cl.
  *H01L 29/423*  (2006.01)
  *H01L 29/78*   (2006.01)
  *H01L 29/20*   (2006.01)

(56) References Cited

FOREIGN PATENT DOCUMENTS

| JP | 61135168 A | 6/1989 |
| JP | 2007134608 A | 5/2007 |
| JP | 2008139284 A | 6/2008 |
| JP | 2009076845 A | 4/2009 |
| JP | 2011082331 A | 4/2011 |
| WO | 8802557 A1 | 4/1988 |

OTHER PUBLICATIONS

Das Gupta, K. et al., "Selective Breakdown of Quantum Hall Edge States and Non-Monotonic Coulomb Drag in a GaAs—AlGaAs Electron-Hole Bilayer," Physica E, vol. 40, No. 5, Dec. 4, 2007, pp. 1693-1696, XP022504197, Elsevier Science, BV, NL, ISSN: 1386-9477, Figure 1.

Morath, C.P. et al., "Layer Interdependence of Transport in an Undoped Electron-Hole Bilayer," Physical Review B, vol. 78, No. 11, Sep. 15, 2008, pp. 115318-1-115318-7, XP000002658710, ISSN: 1098-0121, DOI: 10.1103/PHYSREVB.78.115318, Figure 1.

Nakajima, A. et al., "Improvement of Unipolar Power Device Performance Using a Polarization Junction," Applied Physics Letters, vol. 89, No. 19, Nov. 7, 2006, pp. 193501-193501, XP012086899, American Insitute of Physics, Melville, NY, US, ISSN: 0003-6951, DOI: 10.1063/1.2372758, the whole document.

Rubel, H. et al., "Fabrication of Independently Contacted and Tuneable 2D-Electron-Hole Systems in GaAs/AlGaAs Double Quantum Wells," Materials Science and Engineering, vol. 51, No. 1-3, Feb. 27, 1998, pp. 207-211, XP004129565, Elsevier Sequoia, Lausanne, CH, ISSN: 0921-5107, DOI: 10.1016/S0921-5107(97) 00261-4, the whole document.

Seamons, J. A. et al., "Undoped Electron-Hole Bilayers in a GaAs/AlGaAs Double Quantum Well," Applied Physics Letters, vol. 90, No. 5, Jan. 30, 2007, pp. 52103-52103-3, ISSN: 0003-6951.

\* cited by examiner

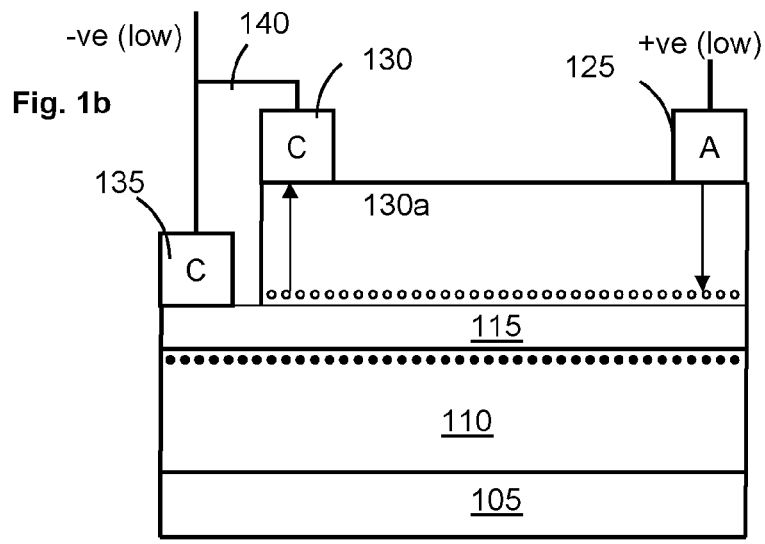
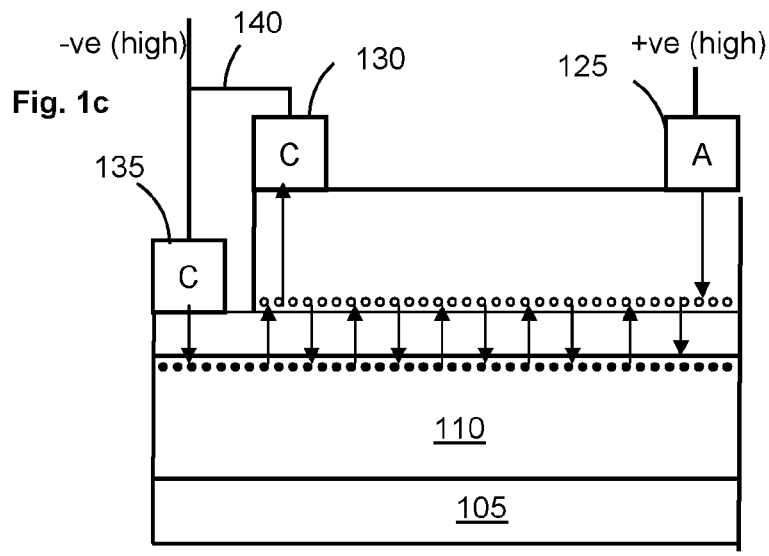
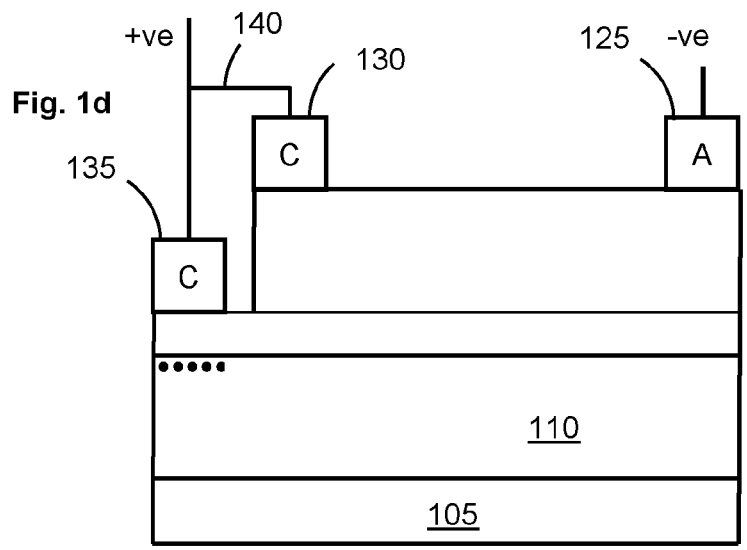

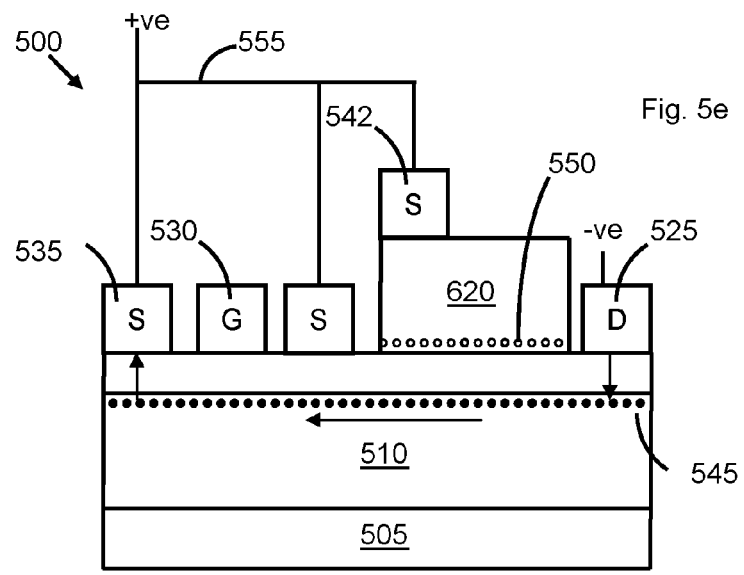
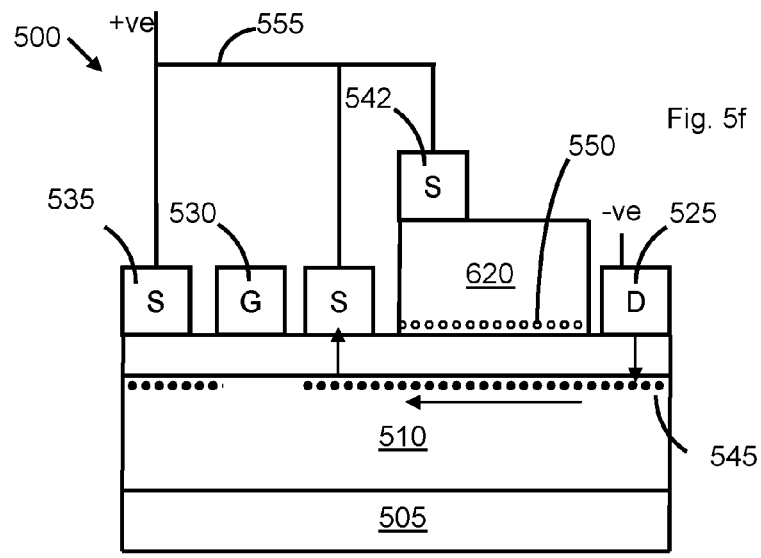
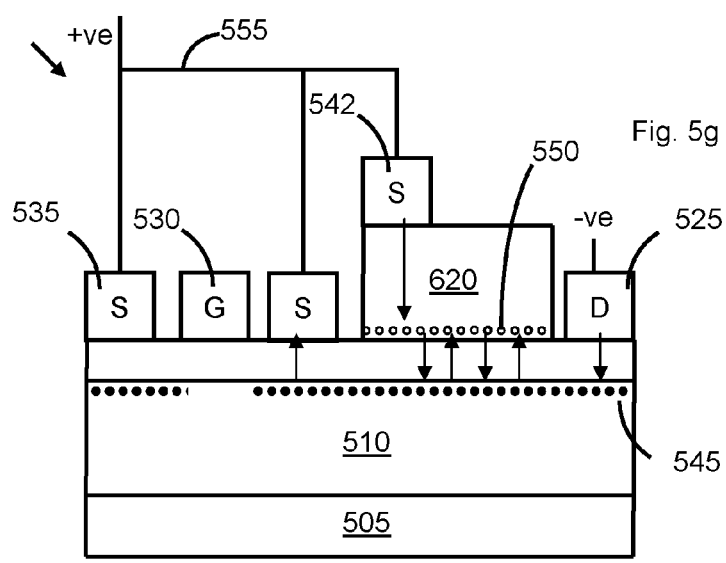

SEMICONDUCTOR DEVICES WITH 2DEG AND 2DHG

The invention relates to semiconductor devices and in particular to semiconductor devices comprising a two dimensional hole gas and making use of the super junction concept.

The Super Junction (SJ) concept in Silicon uses a stack of layers, alternately doped with a p- or n-type dopant, such that the charge in one layer is compensated by the opposite-polarity charge in the next layer, to achieve a high overall charge density. This requires precise doping. Super-Junction based power MOSFETs are commercially available today.

Group III nitride semiconductors, are thought to be good candidates for next generation power devices. They have high electron-saturation velocities, high breakdown fields and wide band gaps, and can provide heterojunctions. At this time, though, it is not possible to implement the SJ concept in group III nitride semiconductors because the doping cannot be controlled with sufficient precision for those semiconductors. In fact, in general it has not been possible to successfully produce a p-type doping in a group III nitride semiconductor device.

There are numerous group-III devices, which take advantage, among other things, of the heterojunctions that can be produced in those devices. A heterojunction is an interface between two layers, or regions, of different semiconductor materials. A heterojunction between different III-nitride semiconductors, e.g. between Aluminium Gallium Nitride (AlGaN) and Gallium Nitride (GaN), can yield a thin layer of highly mobile, highly concentrated electrons thereby resulting in regions with very low resistivity. This layer is called a two-dimensional electron gas (2DEG).

Research effort has gone into developing devices containing parallel n-channels using respective 2DEGs, to reduce overall channel resistivity in the devices. See, for example, patent application US 2009/0114948 A1. However, further developments in devices that can reduce power consumption are highly desirable.

The present invention provides a semiconductor device comprising: a substrate; three semiconductor layers supported on the substrate; wherein the semiconductor layers are arranged to form a 2DHG and a 2DEG separated by a polarization layer; a plurality, or group, of electrodes comprising: first and second electrodes electrically connected to the 2DHG so that current can flow between them via the 2DHG; and a third electrode electrically connected to the 2DEG so that when a positive voltage is applied to the third electrode, for example with respect to one of the other electrodes, the 2DEG and the 2DHG will be at least partially depleted.

Spontaneous polarization, which is required for the formation of the 2DEG and 2DHG, occurs to a greater or lesser extent in a number of different semiconductor materials. Suitable semiconductors include III-V semiconductors, II-VI semiconductors, and organic (polymer) semiconductors such as PVDF, poly(vinylidene fluoride). Of the III-V semiconductors, group III nitrides are particularly suitable in some embodiments. Examples of II-VI semiconductors are ZnO and MgZnO.

The semiconductor layers may all be of the same semiconductor material, or they may be of different materials.

Therefore at least one of the semiconductor layers may be a III-V semiconductor, which may be a group III nitride. In some cases all three of the semiconductor layers may be III-V semiconductors, and may be group III nitrides.

The electrical connection may be direct, or indirect for example being through one or more intermediate layers of material. Also the electrical connection may be of any type, such as ohmic contact or Schottky contact.

One of the semiconductor layers may be between the other two semiconductor layers. It may form the polarization layer. The 2DHG may be formed at an interface between the polarization layer and another of the semiconductor layers. The 2DEG may be formed at an interface between the polarization layer and the other of the semiconductor layers.

The first and second electrodes may comprise a cathode and an anode respectively. One of the electrodes may be arranged to form a Schottky barrier between it and the semiconductor layer it is connected through which current can flow in one direction only between the anode and the cathode.

The cathode may be arranged to form the Schottky barrier and may be connected to the third electrode.

The device may comprise a transistor wherein the plurality of electrodes comprises a source electrode, a gate electrode and a drain electrode each connected to one of the semiconductor layers. The source electrode and the drain electrode may be connected to the 2DHG, or the 2DEG. The gate electrode may be operable to vary the current between the source electrode and the drain electrode.

The source electrode may be connected to the 2DHG and may be also connected to the 2DEG via the third electrode.

The transistor may be an enhancement mode transistor, the gate electrode extending through the 2DHG, or 2DEG.

The transistor may be a depletion mode transistor, the gate electrode being supported over a part of the 2DHG, or 2DEG.

The device may comprise a second plurality, or group, of electrodes. At least one electrode may be common to the first plurality and the second plurality. Therefore one electrode may form two different functions, one associated with the first plurality and one associated with the second plurality. The second plurality may comprise first and second electrodes each connected to one of the semiconductor layers. The first electrode of the second plurality may be connected to the second electrode of the second plurality via the 2DEG, or the 2DHG.

The second plurality of electrodes may comprise an anode and a cathode each of which may be connected to one of the semiconductor layers. One of the second plurality may be arranged to form a Schottky barrier between it and the semiconductor layer it is connected to. The anode of the second plurality may be connected to the cathode of the second plurality via the 2DEG, or the 2DHG so as to produce a Schottky barrier diode.

The anode of the second plurality may be arranged to form the Schottky barrier. The anode may be connected to the 2DHG and to the 2DEG.

The anode may be connected to the drain electrode. The cathode may be connected to the source electrode.

The device may comprise an n-channel transistor. The second plurality of electrodes may comprise a source electrode, a gate electrode and a drain electrode each connected to one of the layers. The source electrode of the second plurality may be connected to the drain electrode of the second plurality via the 2DEG. The gate electrode of the second plurality may be operable to vary the current between the source electrode and the drain electrode of the second plurality.

The transistor may be an enhancement mode transistor, the gate electrode of the second plurality extending through the 2DEG.

The transistor may be a depletion mode transistor, the gate electrode of the second plurality being supported over the 2DEG.

The drain electrode of the first plurality and the drain electrode of the second plurality may be connected together.

The device may comprising a reverse conducting transistor wherein the second plurality of electrodes form a Schottky barrier diode.

The present invention further provides a device, for example an integrated device, comprising two devices according to the invention, wherein an anode of one device is connected to a source electrode of the other device, and a cathode of one device is connected to a drain electrode of the other device thereby to form a reverse conducting transistor.

The present invention further provides a device comprising: a first device according to the invention and a second device according to the invention wherein a drain electrode of the first device is connected to a drain electrode of the second device to form a bi-directional transistor.

The first semiconductor layer may comprise a group III nitride, such as an undoped aluminium gallium nitride 'u-Al-GaN' semiconductor layer.

The second semiconductor layer may comprise a group III nitride, such as an undoped Gallium Nitride 'u-GaN' semiconductor layer. The third semiconductor layer may comprise a group III nitride, such as a u-GaN semiconductor layer.

The second semiconductor layer may be is less than half as thick as the first semiconductor layer. The third semiconductor layer may be more than ten times the thickness of the first semiconductor layer.

The present invention further provides a reverse conducting transistor comprising: a substrate; three semiconductor layers supported on the substrate; wherein the semiconductor layers are arranged to form a 2DHG and a 2DEG separated by a polarization layer, and a plurality of electrodes comprising: a source electrode and a drain electrode, a gate electrode arranged to vary the current flowing between the source and drain electrodes via at least one of the 2DEG and the 2DHG, and a further electrode arranged to form a Schottky barrier diode with one of the layers to provide a reverse conducting path. The transistor may include any of the optional features of the semiconductor devices according to the invention described above.

The present invention further provides a bi-directional transistor comprising: a substrate; three semiconductor layers supported on the substrate; wherein the semiconductor layers are arranged to form a 2DHG and a 2DEG separated by a polarization layer; and a plurality of electrodes comprising: a first source, a second source, and at least one gate electrode arranged to vary the current flowing in either direction between the two sources via at least one of the 2DEG and the 2DHG. The transistor may include any of the optional features of the semiconductor devices according to the invention described above.

The present invention further provides a bi-directional transistor comprising: a substrate; three semiconductor layers supported on the substrate; wherein the semiconductor layers are arranged to form a 2DHG and a 2DEG separated by a polarization layer, and a plurality of electrodes comprising: three electrodes comprising two source-drain pairs, each pair being connected together via one of the 2DEG and the 2DHG, and two gate electrodes each arranged to vary the current flowing between the electrodes in a respective one of the gate-source pairs. The transistor may include any of the optional features of the semiconductor devices according to the invention described above.

One of the electrodes may be mounted on one of the layers and connected to the 2DEG and another of the electrodes may be mounted on another of the layers and connected to the 2DHG. An upper one of the layers may only partially cover a lower one of the layers. One of the electrodes may be mounted on a part of the lower layer not covered by the upper layer.

The invention also provides a device comprising: a transistor, which may be a 2DHG transistor or a 2DEG transistor as described above; and a Schottky barrier diode, as described above; wherein an anode and a cathode of the diode are connected to the source electrode and drain electrode of the transistor to form a reverse conducting transistor.

The invention also provides a device comprising: a first 2DHG transistor, as described above; and a second 2DHG transistor, as described above; wherein the drain electrode of the first transistor is connected to the drain electrode of the second transistor.

The respective regions of p- and n-type carriers may be induced at respective interfaces between layers, as a result of the heterojunctions when different Group-III nitride materials are formed over one another. In that case the carriers may be concentrated at the interface. Alternatively the regions may be formed through impurity doping, and may be spread through the whole or part of the semiconductor layer they are in. The regions may coextend with the respective interfaces or semiconductor layers, or they may extend over only a part of the respective interfaces or semiconductor layers.

Embodiments of the invention will now be described, by way of example only, with reference to the accompanying drawings:

FIG. 1 schematically shows a 2DHG Schottky barrier diode in accordance with a first embodiment of the invention.

Figure 4:
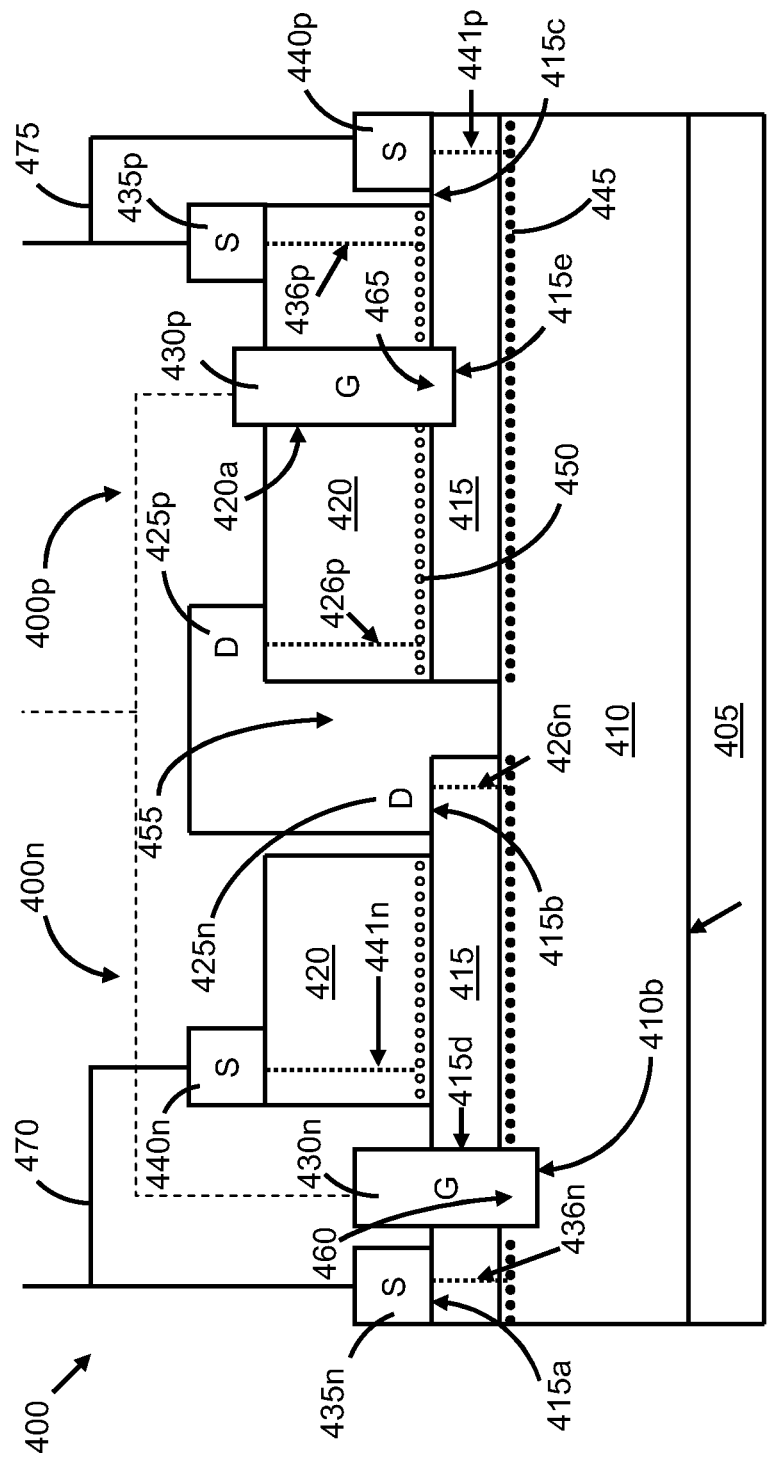
Figure 5:
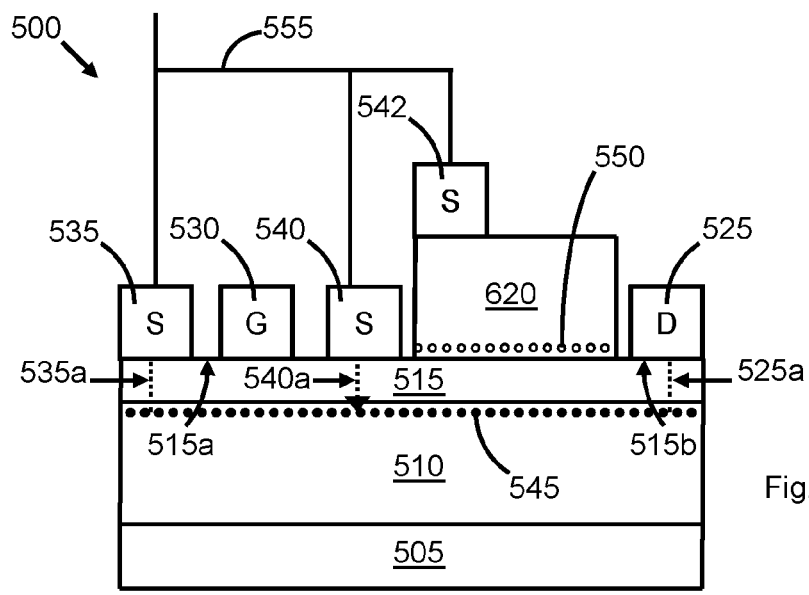
Figure 5A:
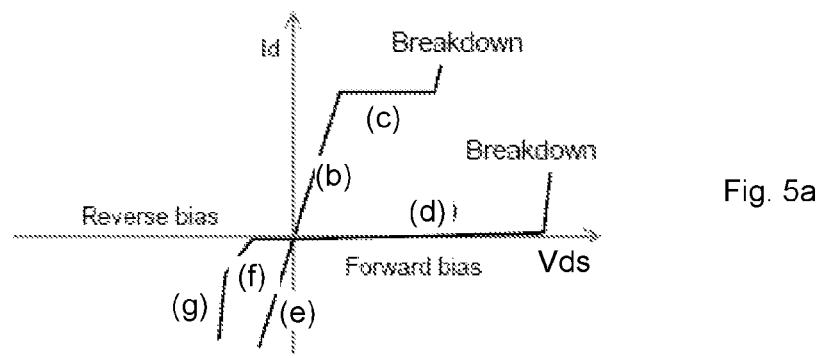
Figure 6:
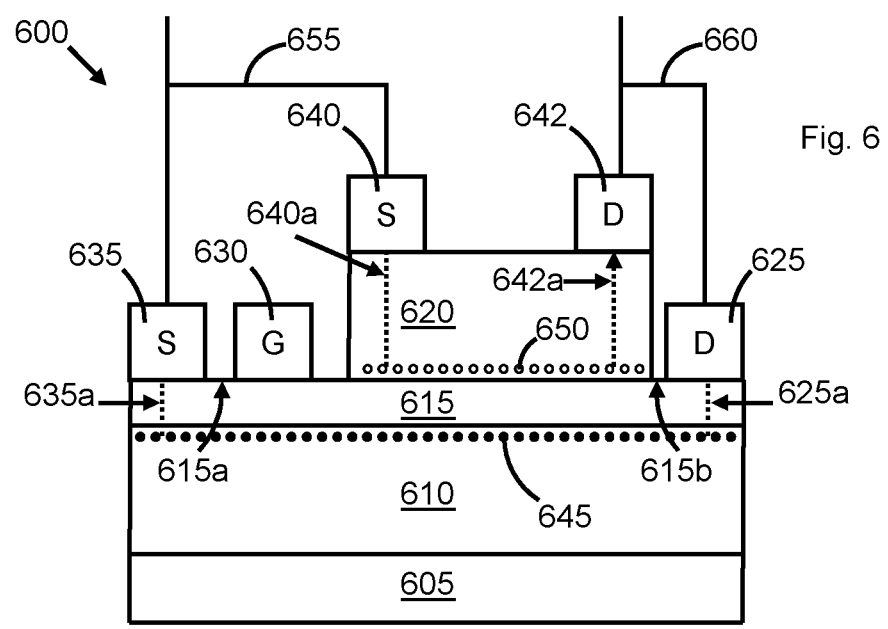
Figure 7:
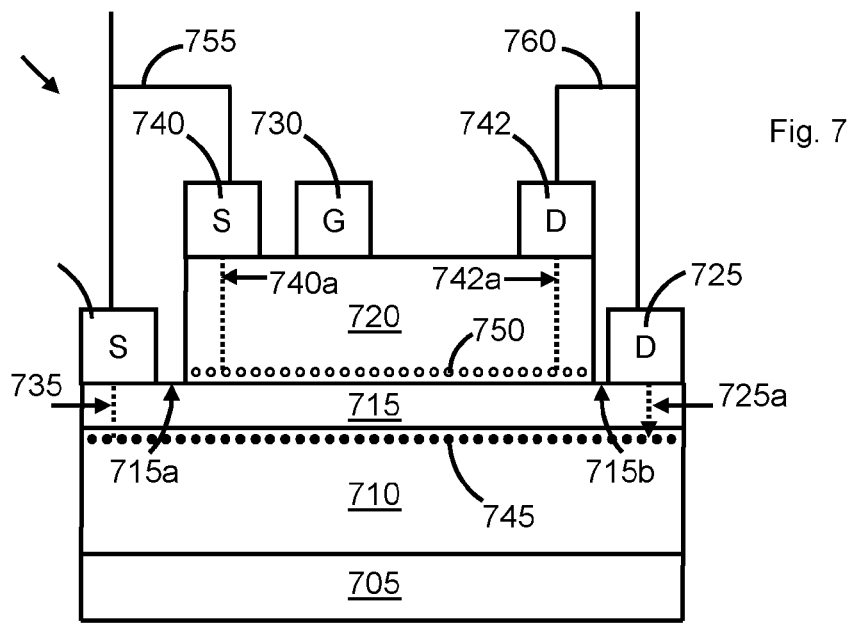
Figure 7A:
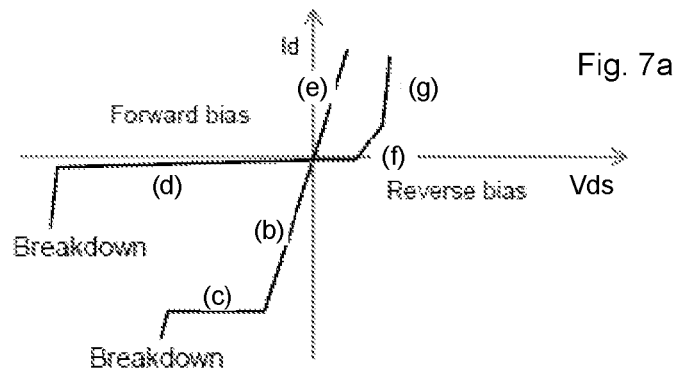
Figure 7B:
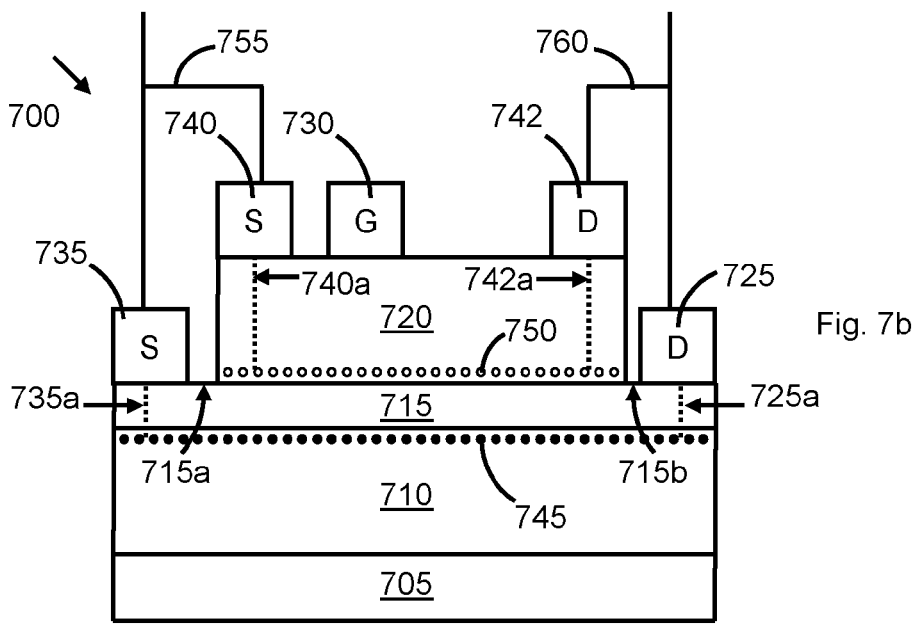
Figure 7C:
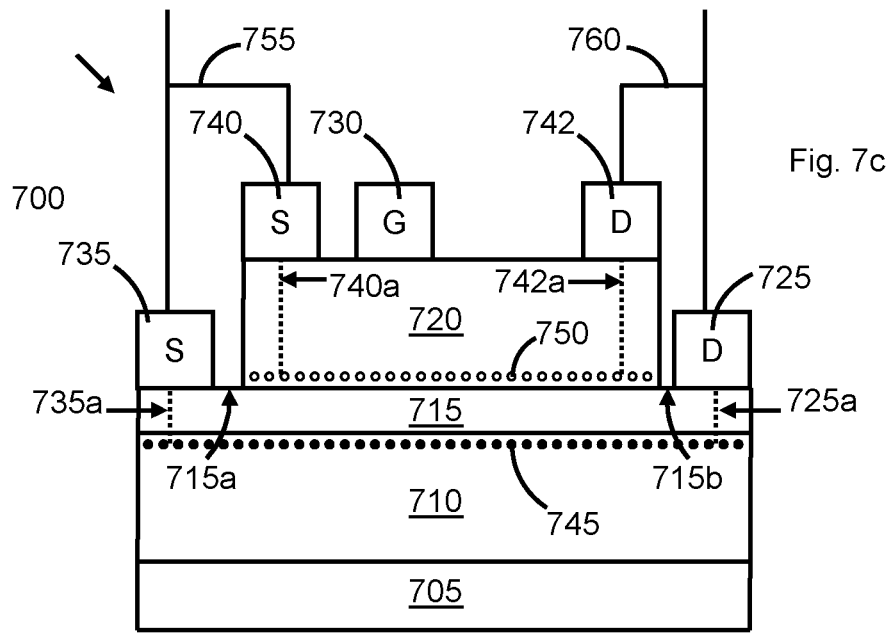
Figure 7D:
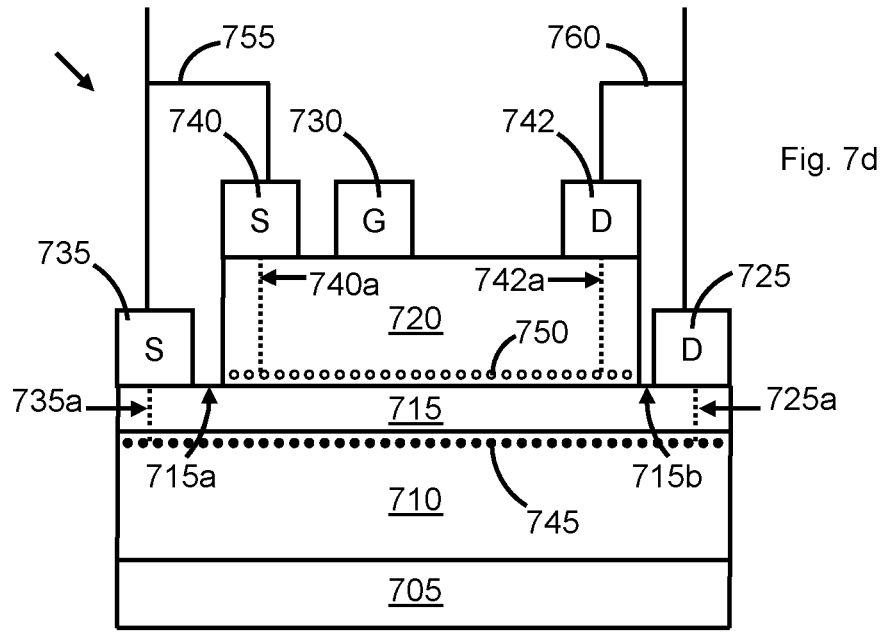
Figure 7E:
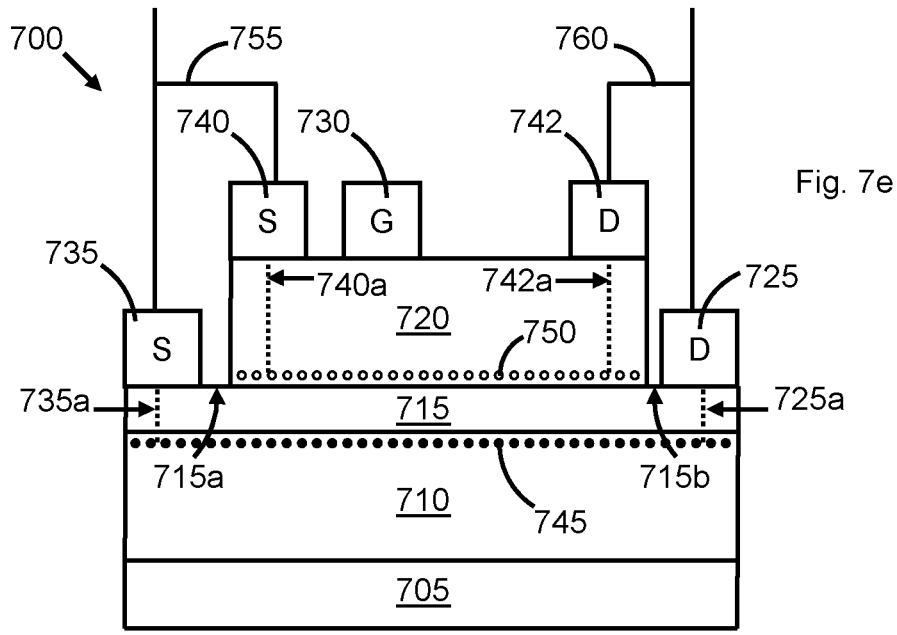
Figure 7F:
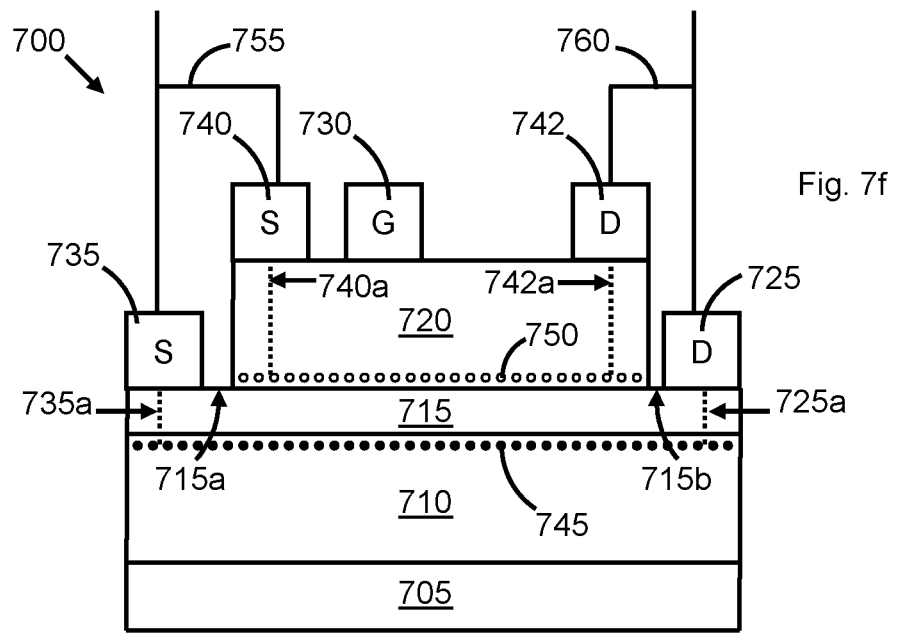
Figure 8:
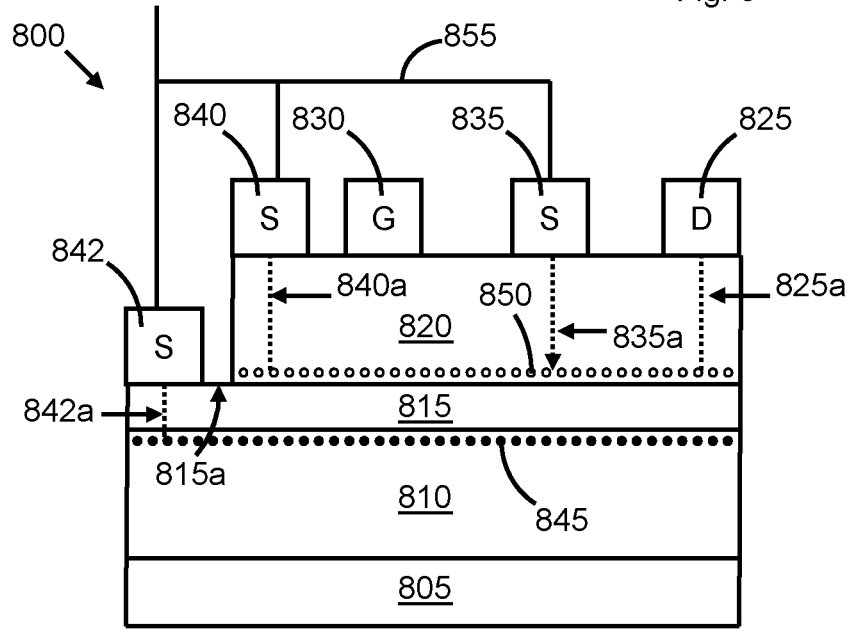
Figure 9:
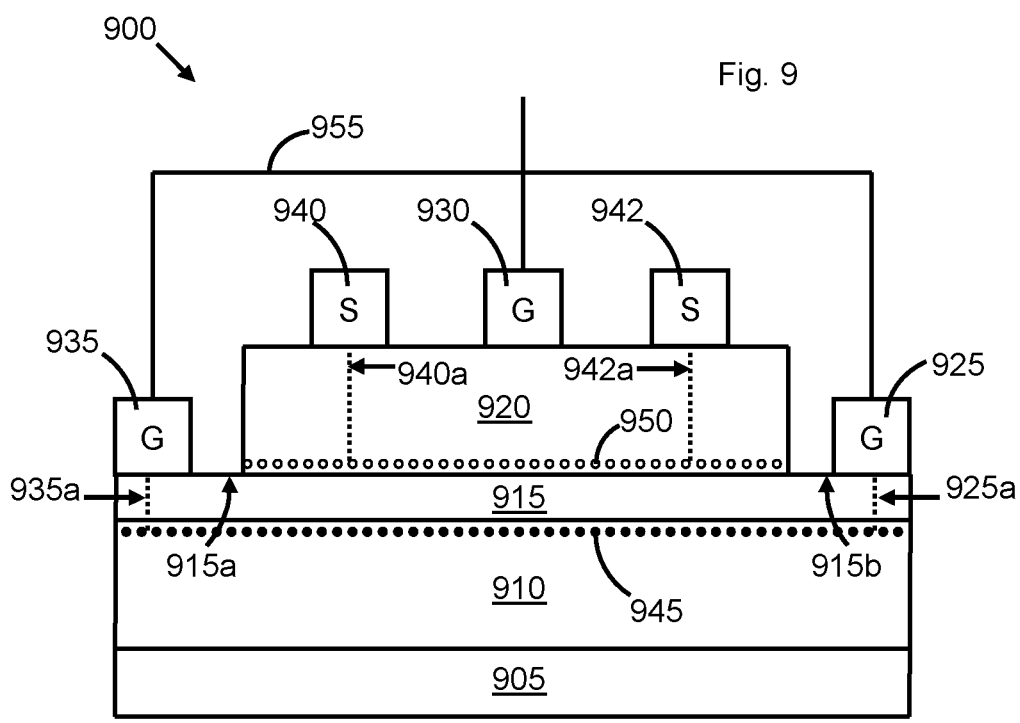

FIG. 4 schematically shows an integrated device for a transistor complementary pair, in accordance with a further embodiment of the invention;

FIG. 5 is a schematic illustration of a reverse conducting transistor according to an embodiment of the invention;

FIG. 5a is a diagram showing the characteristics of the reverse conducting transistor of FIG. 5;

FIGS. 5b to 5g show the transistor of FIG. 5 in various different states;

FIG. 6 is a schematic illustration of a reverse conducting transistor according to a further embodiment of the invention;

FIG. 7 is a schematic illustration of a reverse conducting transistor according to an embodiment of the invention;

FIG. 7a is a diagram showing the characteristics of the reverse conducting transistor of FIG. 7;

FIGS. 7b to 7f show the transistor of FIG. 7 in various different states;

FIG. 8 schematically shows reverse conducting transistors in accordance with a further embodiment of the invention;

FIG. 9 shows a one-gate type bidirectional transistor in accordance with a further embodiment of the invention; and

FIRST EMBODIMENT

2DHG SJ SBD

Figure 1:
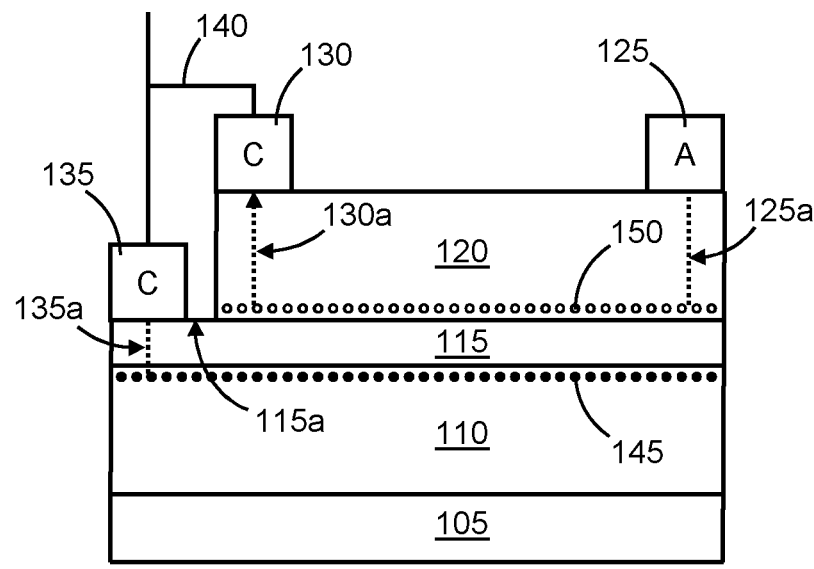
FIG. 1a is a diagram showing the characteristics of the diode of FIG. 1.
FIGS. 1b to 1d show the diode of FIG. 1 in various different states.

Referring to FIG. 1, a Schottky barrier diode (SBD) 100 according to one embodiment of the invention comprises a substrate 105, on which are grown three III-nitride semiconductor layers 110, 115, 120. Three electrodes 125, 130, 135 are formed on the semiconductor layers 110, 115, 120.

An undoped Gallium Nitride (u-GaN) layer 110 is provided directly onto the substrate 105. An undoped Aluminium Gallium Nitride (u-AlGaN) layer 115 is provided over the first u-GaN layer 110 so that a mobile two-dimensional electron gas (2DEG) 145 forms at the heterointerface between the u-GaN and u-AlGaN layers 110, 115. A third layer 120, comprising a second u-GaN layer, is positioned over the u-AlGaN layer 115, so that a two dimensional hole gas (2DHG) 150, which is a planar region, or layer, with majority p-type carriers, is induced at the heterointerface between the u-AlGaN and third layers 115, 120. The 2DEG 145 extends as a continuous layer, or planar region, beneath the whole of the 2DHG 150, and specifically under all of the electrodes 125, 130, 135.

The semiconductor layers are arranged such that the respective quantities of positive and negative charges in the 2DHGs and 2DEGs are approximately equal, so a high charge balance condition can be achieved to support high voltage capability. Further information on this point is provided in "Improvement of unipolar power device performance using a polarization junction", Nakajima, A et. al., Applied Physics Letters, 2006, vol. 89 no. 19, pages 193501.

Two of the electrodes—an anode 125 and a cathode 130— are provided on top of the third layer 120. The third layer 120 is thin enough to permit the anode 125 and the cathode 130 to be electrically connected to the 2DHG 150 by respective current paths 125a, 130a. The anode 125 is formed from a metal with a work function that permits an ohmic connection to the 2DHG 150, e.g. nickel or platinum. The cathode 130 is formed from a metal with a work function that results in a Schottky barrier connection to the 2DHG 150, e.g. from an alloy of Ti and Al. Accordingly, the anode 125 is electrically connected to the cathode 130 by the 2DHG 150, via a Schottky barrier junction, and so forms a 2DHG super junction (SJ) Schottky barrier diode. For ease of reference, typical metals that give Ohmic and Schottky contacts to the 2DEG and 2DHG are:

|  | Large work function (e.g. Ni, Pt) | Small work function (e.g. Ti and Al alloy) |
| --- | --- | --- |
| 2DHG | Ohmic | Schottky |
| 2DEG | Schottky | Ohmic |

In this diode 100, the third layer 120 extends over most but not all of the u-AlGaN layer 115, leaving an exposed upper surface 115a of the u-AlGaN layer 115 at one end. A further cathode 135 is provided on the exposed upper surface 115a, so that the cathode 130 is positioned between the further cathode 135 and the anode 125. In the diode 100, the two cathodes 130, 135 can be electrically connected together. The further cathode 135 is formed from a metal with a work function that permits an ohmic connection to the GaN layer 110 and hence to the 2DEG 145. For example, an alloy of titanium (Ti) and aluminium (Al) may be used for ohmic connection to the 2DEG 145. The u-AlGaN layer 115 is thin enough to permit the further cathode 135 to be electrically connected to the 2DEG 145. In this instance, 2DEG 145 acts as a field strength reducing layer, through charge balance as will be described in more detail below. The further cathode does not have to extend across all of the width of the device cross-section (perpendicular to the plane of FIG. 1). A contact made somewhere along the width of the device is adequate. In a modification to this embodiment, the two cathodes 130, 135 are not connected together but are controlled independently.

Figure 1A:
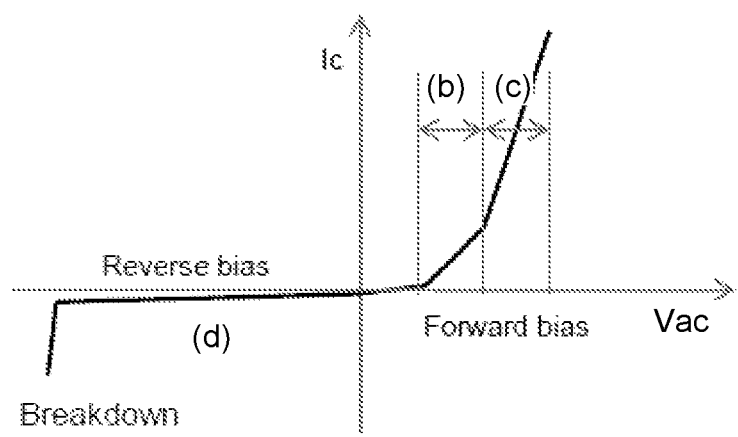

Referring to FIG. 1a if a forward voltage is applied between the anode 125 and the cathodes 130, 135 then, when the threshold voltage of the Schottky barrier diode is exceeded, at about 1V, the diode will start to conduct between the anode 125 and the first cathode 130 via the 2DHG 150, as shown in FIG. 1b, and as indicated by (b) in FIG. 1a. If the forward voltage is increased further then the p-n junctions between the AlGaN layer 115 and the two GaN layers 110 120, which act as a pn junction diode, will start to conduct between the anode 125 and the second cathode 135 via the 2DEG 145. This reduces the resistance as in this state both the 2DHG and the 2DEG are conducting, as shown in FIG. 1c and as indicated by (c) in FIG. 1a, producing bipolar conduction. If a reverse voltage is applied between the two cathodes 130, 135 and the anode 125, so that the cathodes are at a positive potential relative to the anode, then the Schottky diode between the first cathode 130 and the top layer 120 will tend not to conduct. Also the positive potential at the cathode will start to deplete the 2DEG 145 and the polarisation in the GaN layer 115, and hence also the 2DHG 150, as shown in FIG. 1d, and as indicated by (d) in FIG. 1a. If the 2DEG and 2DHG are well balanced, their depletion can be almost complete so that they will cease to conduct. This means that the electric field around the electrodes do not increase rapidly with increased reverse voltage, so the device can withstand high reverse voltages, before breakdown occurs.

SECOND EMBODIMENT

Figure 2:
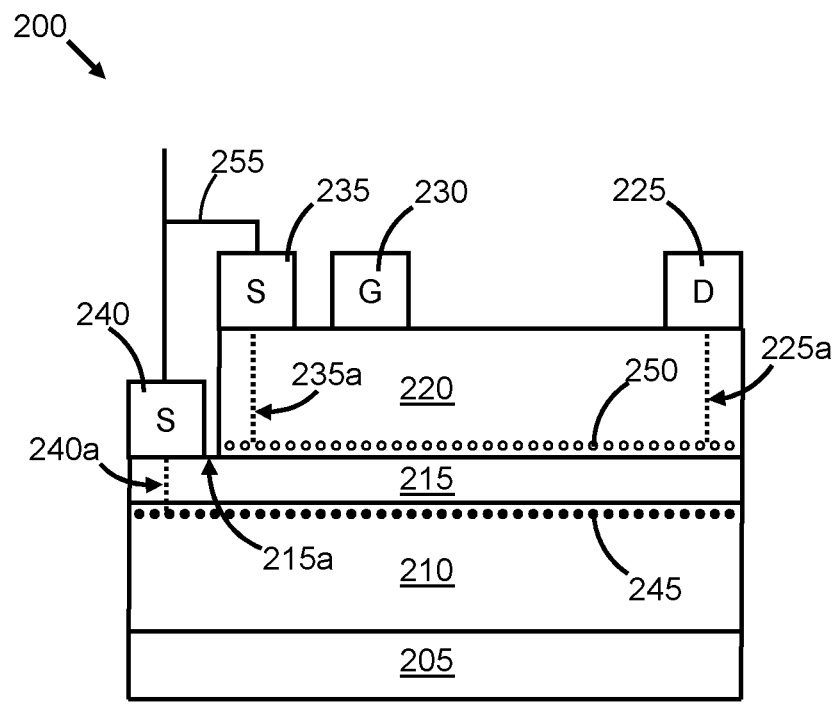
FIG. 2 is a schematic illustration of a depletion mode p-channel transistor according to an embodiment of the invention.

Referring to FIG. 2, a depletion mode p-channel transistor 200 according to a second embodiment of the invention is made from a wafer having the structure described above with reference to the first embodiment. Corresponding wafer layers will be referred to in this embodiment by the reference numerals of the first embodiment, but increased by 100. Thus, the transistor 200 comprises a substrate 205, on which are grown three III-nitride semiconductor layers 210, 215, 220. Four electrodes 225, 230, 235, 240 are formed on the semiconductor layers 210, 215, 220.

Three of the electrodes—a drain electrode 225, a gate electrode 230 and a source electrode 235—are provided on top of the third layer 220. The drain electrode 225 and the source electrode 235 are both formed from a metal with a work function that permits an ohmic connection to the 2DHG 250. The third layer 220 is thin enough to permit the drain electrode 225 and the source electrode 235 to be electrically connected to the 2DHG 250 by respective ohmic current paths 225a and 235a. Accordingly, the drain electrode 225 is electrically connected to the source electrode 235 by the 2DHG 250 i.e. by a p-channel.

The gate electrode 230 is made from a metal with a small work function which achieves a Schottky-barrier junction between it and the upper GaN layer 220 and hence with the 2DHG 250. It is positioned between the drain electrode 225 and source electrode 235, above the p-channel formed along the 2DHG 250, and is operable to affect the p-channel. Accordingly, the drain electrode 225, gate electrode 230 and source electrode 235 electrodes are arranged to form a depletion mode p-channel transistor.

In this transistor 200, the third layer 220 extends over most but not all of the u-AlGaN layer 215, leaving an exposed upper surface 215a of the u-AlGaN layer 215 at one end. A further source electrode 240 is operatively provided on the exposed upper surface 215a, and is in this embodiment electrically connected to the first source electrode 235, though in other embodiments it can be controlled independently. The further source electrode 240 is formed from a metal with a work function that permits an ohmic connection to the AlGaN layer 215 and hence to the 2DEG 245. The further source does not have to extend across all of the width of the device cross-section (perpendicular to the plane of FIG. 2). A contact made somewhere along the width of the device is adequate. The u-AlGaN layer 215 is thin enough to permit the further source electrode 240 to be electrically connected to the 2DEG 245 by an ohmic current path 240a. The 2DEG 245 extends as a continuous layer beneath the source electrode 235, the gate electrode 230 and the drain electrode 225.

Figure 2A:
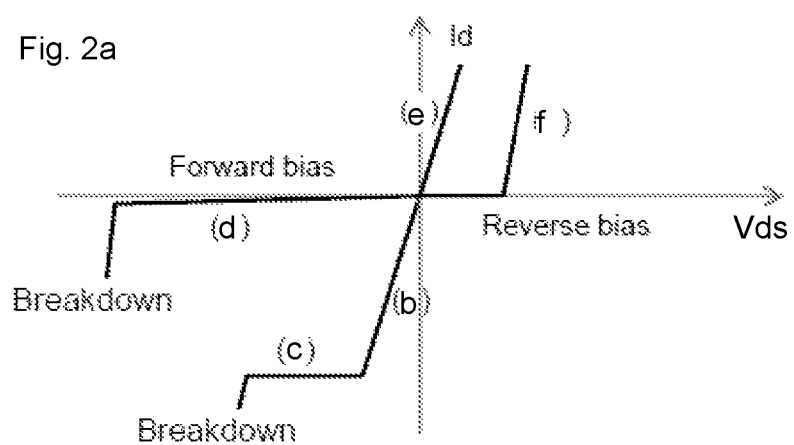
FIG. 2a is a diagram showing the characteristics of the transistor of FIG. 2.

Referring to FIG. 2a, the depletion mode p-channel transistor 200 operates in a similar manner to known p-channel field effect transistors (FETs).

Figure 2B:
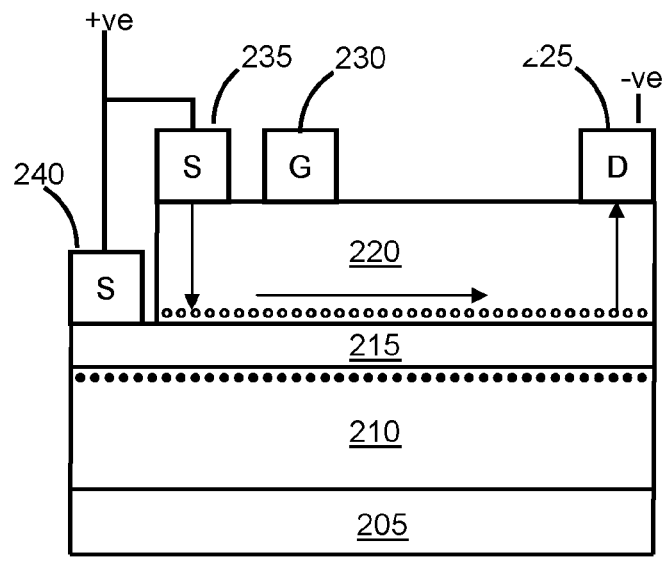
FIGS. 2b to 2f show the transistor of FIG. 2 in various different states.
Figure 2C:
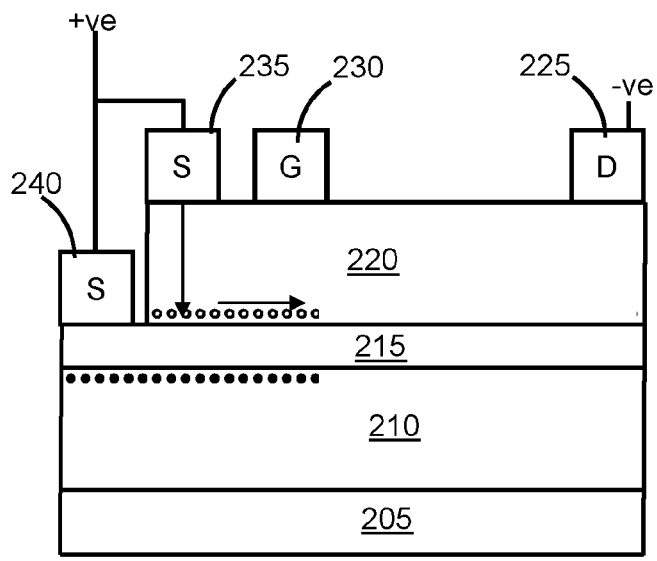

The depletion mode p-channel transistor 200 is a 'normally-on' type of transistor in that it has a positive threshold voltage. Therefore when the potential at the gate with respect to the source, the gate-source voltage (Vgs), is zero the transistor 200 conducts when forward bias voltage Vds is applied between the source and drain i.e. when the drain is at a negative voltage with respect to the source, as shown in FIG. 2b, and indicated by (b) in FIG. 2a. Since the transistor 200 is a p-channel (2DHG) device, when it conducts current flows from the source electrode 235 to the drain electrode 225. Referring to FIG. 2c, if the current reaches a saturation threshold, the 2DEG and 2DHG start to deplete as the voltage is further increased and the current does not increase further, until a breakdown voltage is reached.

Figure 2D:
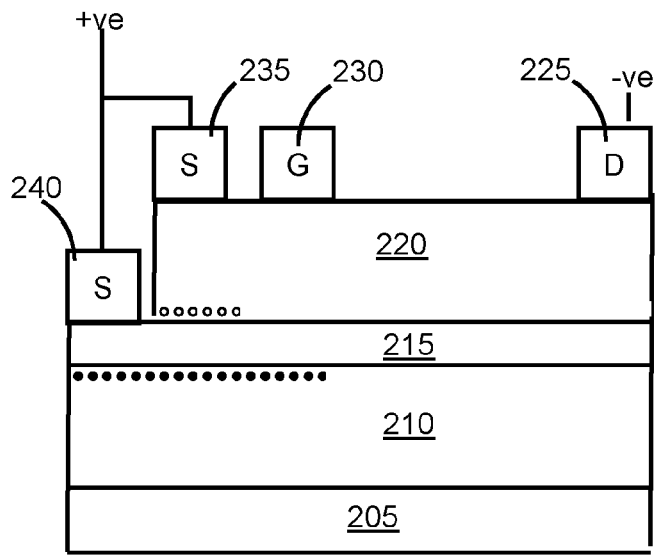

Increasing Vgs from zero to above the threshold voltage causes a depletion region around the gate electrode 230 to enlarge, such that it encroaches on the channel along the 2DHG and switches the transistor off i.e. it stops the current from the source electrode 235 to the drain electrode 225, as shown in FIG. 2d. With forward bias, as shown in FIG. 2d, charge balancing (depletion) between the 2DEG and 2DHG occurs so the source-drain voltage Vds can be increased to high levels before breakdown occurs.

Figure 2E:
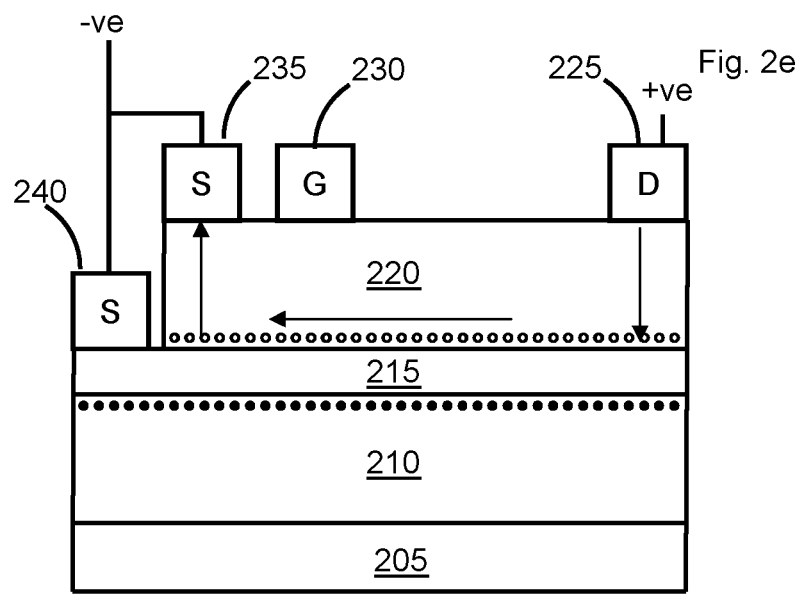
Figure 2F:
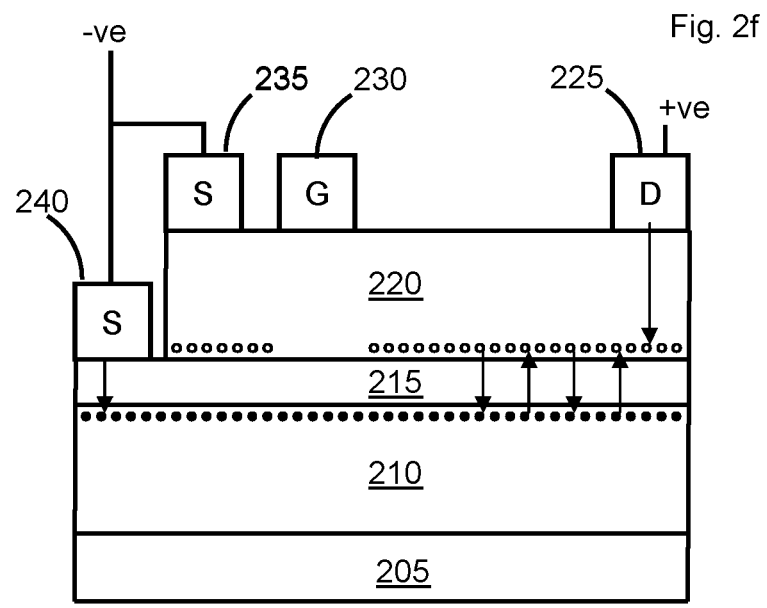

When a reverse bias voltage is applied between the source and drain, the device conducts via the 2DHG when the gate is turned on, as shown in FIG. 2e. If the gate is turned off, the device does not conduct at low reverse bias voltages, but when a threshold voltage is reached the 2DEG starts to conduct as shown in FIG. 2f.

In a further embodiment two of the p-channel transistors 200 of this embodiment are provided, adjacent one another, on the same wafer with the respective drain electrodes 225 connected together forming a bidirectional transistor as an integrated device.

In the embodiment of FIG. 2, the gate electrode 230 can extend down into the third layer 220 by different amounts to vary the threshold voltage at which it will turn off. In other embodiments, as described below, it can extend through the whole of the third layer 220 and through the 2DHG 250 in which case the transistor is an enhancement mode transistor. In that case the distance it extends into the second layer 215 can be varied to vary the threshold voltage at which it turns on.

THIRD EMBODIMENT

Figure 3:
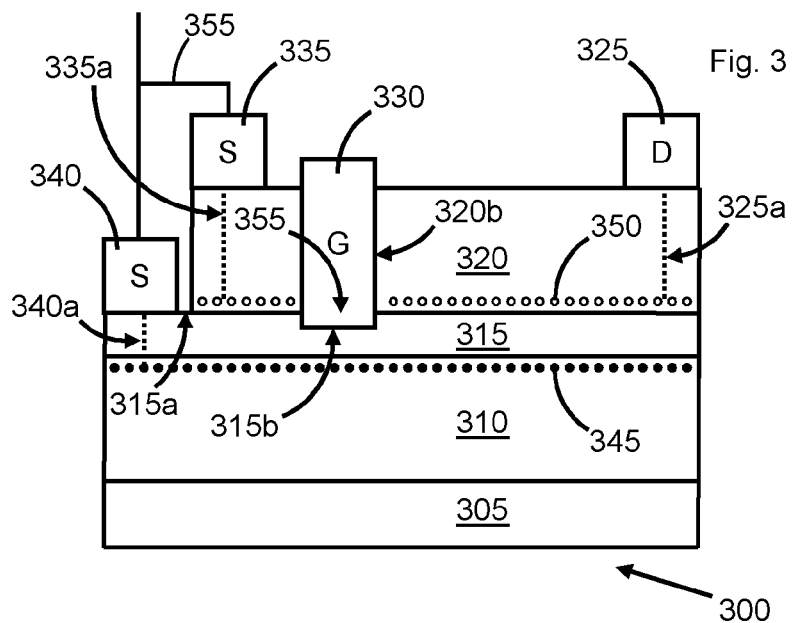
FIG. 3 is a schematic illustration of an enhancement mode p-channel transistor according to an embodiment of the invention.

Referring now to FIG. 3, an enhancement mode p-channel transistor 300 according to a third embodiment of the invention is made from a wafer having the structure described above with reference to the first embodiment. Corresponding wafer layers will be referred to in this embodiment by the reference numerals of the first embodiment, but increased by 200. Thus, the transistor 300 comprises a substrate 305 and three III-nitride semiconductor layers 310, 315, 320. Four electrodes 325, 330, 335, 340 are formed on the semiconductor layers 310, 315, 320.

Two of the electrodes—a drain electrode 325 and a source electrode 335—are provided on top of the third layer 320. The source electrode 335 and the drain electrode 325 are each formed from a metal with a work function that permits ohmic connection to the 2DHG 350. The third layer 320 is thin enough to permit the drain electrode 325 and the source electrode 335 to be electrically connected to the 2DHG 350 by respective ohmic current paths 325a, 335a.

A gap 355 is etched through the third layer 320 and part way into the u-AlGaN layer 315, to provide a second exposed surface 315b. A gate electrode 330 is provided in, and extends through, the gap 355. The gate electrode 330 is a metal insulator semiconductor (MIS) gate, and so comprises a metal separated from the surface of the gap 355 by an insulating dielectric. The gate electrode 330 is positioned between the other electrodes, with the drain electrode 325 on one side and the source electrode 335 on the other side, and extends through the p-channel formed along the 2DHG 150. Therefore when no gate voltage is applied, the 2DHG 350 is interrupted in the region around the gate 330 and so the device is off. In use, when a negative voltage of a magnitude above a threshold is applied to the gate electrode 330, with respect to the source electrode 335, a 2DHG is formed around the gate electrode 330. In this condition the 2DHG is connecting the drain electrode 325 to the source electrode 335. Accordingly, the electrodes are arranged to produce an enhancement mode p-channel (2DHG) transistor.

The third layer 320 extends over most but not all of the u-AlGaN layer 315, leaving an exposed upper surface 315a of the u-AlGaN layer 315 at one end. A further source electrode 340 is operatively provided on the exposed upper surface 315a. The further source electrode 340 is formed from a metal with a work function that permits an ohmic connection to the 2DEG 345. The u-AlGaN layer 315 is thin enough to permit the further source electrode 340 to be electrically connected to the 2DEG 345 by a current path 340a. The further source does not have to extend across all of the width of the device cross-section (perpendicular to the plane of FIG. 1). A contact made somewhere along the width of the device is adequate. The 2DEG 345 extends as a continuous layer beneath the two source electrodes 335, 340, the gate electrode 330 and the drain electrode 325.

Figure 3A:
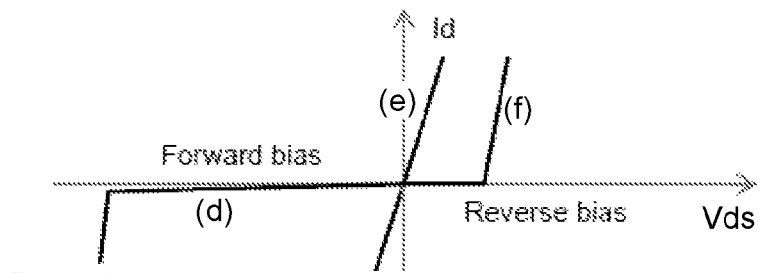
FIG. 3a is a diagram showing the characteristics of the transistor of FIG. 3.

Referring to FIG. 3a, the enhancement mode p-channel transistor 300 operates in a similar manner to other enhancement mode FETs.

Figure 3B:
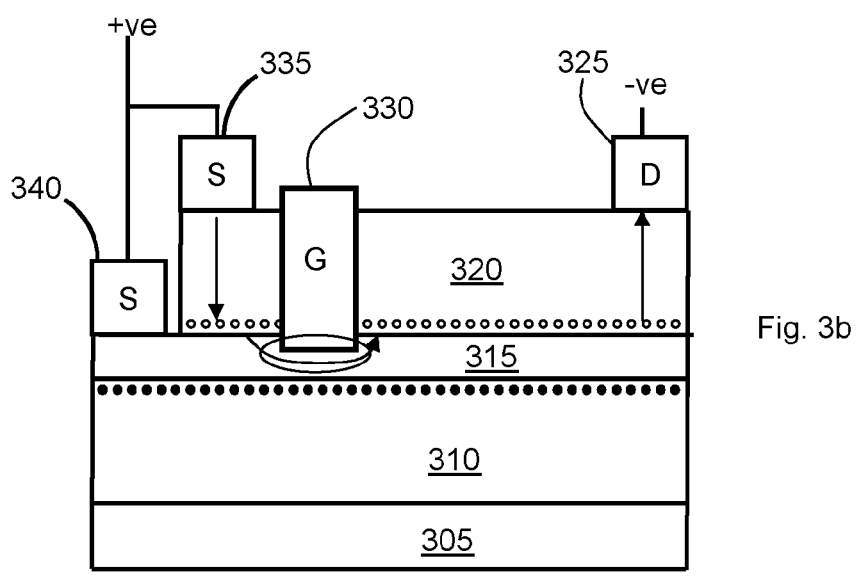
FIGS. 3b to 3f show the transistor of FIG. 3 in various different states.
Figure 3C:
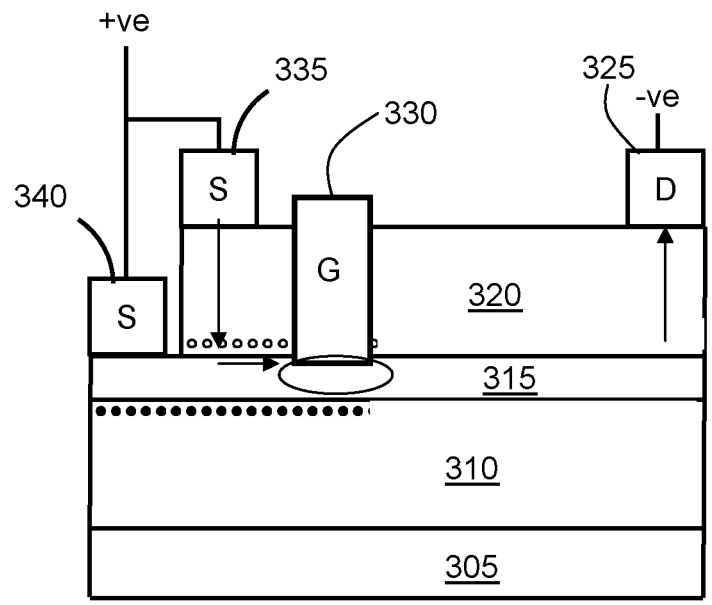
Figure 3D:
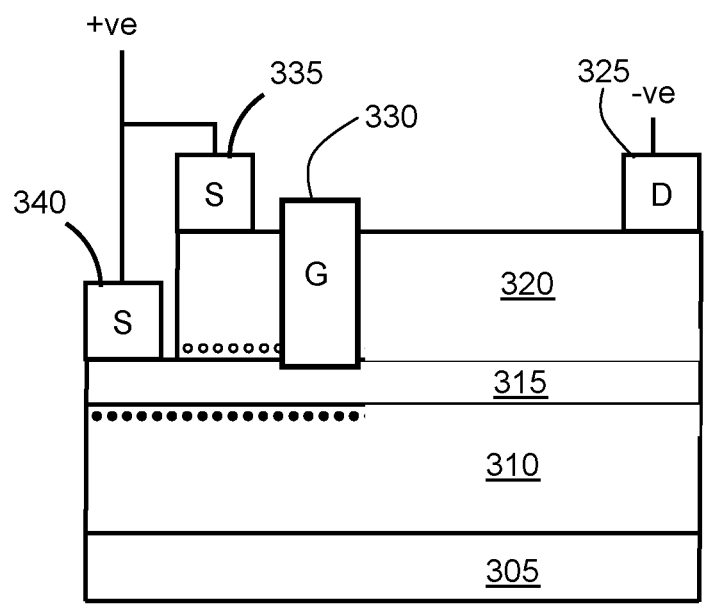

The enhancement mode p-channel transistor has a negative threshold voltage and therefore is a 'normally-off' type of transistor i.e. when Vgs=0 no current flows between drain and source electrodes 325, 335. Referring to FIG. 3b, when a negative Vgs of magnitude above the threshold voltage is applied, a hole gas forms around the gate electrode 330 thereby completing a p-channel between the source and drain electrodes 335, 325 so that current flows from the source electrode 335 to the drain electrode 325 as shown in FIG. 3b when a forward bias voltage is applied between the source and drain. Further increasing the magnitude of Vgs will increase the current until a saturation point is reached. After saturation, further increasing the voltage will not increase the current, as the 2DEG and 2DHG start to deplete, as shown in FIG. 3c, until a breakdown voltage is reached, at which point the current then starts to increase rapidly. When Vgs is below a threshold voltage the 2DHG around the gate electrode is not present, and the gate is turned off. Therefore a forward bias voltage will not cause current to flow until it reaches a breakdown voltage. As shown in FIG. 3d, in this state the increasing voltage tends to cause charge balancing between the 2DEG and 2DHG by the super junction effect. This allows the voltage to reach high levels before breakdown occurs.

Figure 3E:
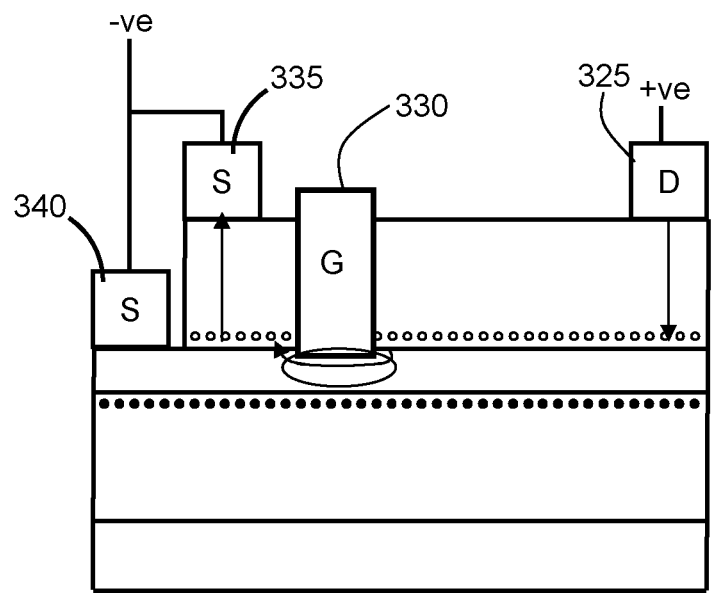
Figure 3F:
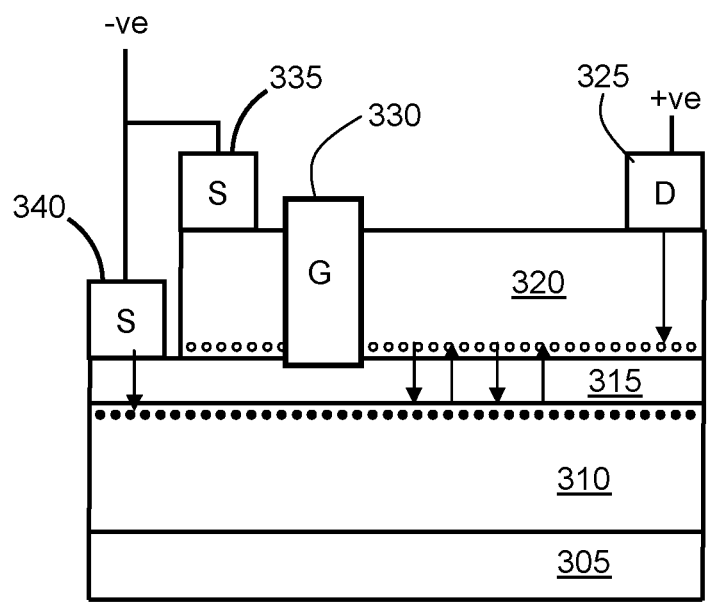

When a reverse bias voltage is applied, and the gate is turned on, the device conducts via the 2DHG as shown in FIG. 3e. If the gate is turned off, there is no current at low voltages, but when the reverse bias voltage reaches a threshold the 2DEG and 2DHG start to conduct providing a current path around the gate electrode as shown in FIG. 3f.

In a further embodiment two of the p-channel transistors 300 of this embodiment are provided, adjacent one another, on the same wafer with the respective drain electrodes 325 connected together forming a bidirectional transistor as an integrated device.

FOURTH EMBODIMENT

Referring to FIG. 4, a complementary transistor pair 400 according to one embodiment of the invention is made from a wafer having the structure described above with reference to the first embodiment. Corresponding wafer layers will be referred to in this embodiment by the reference numerals of the first embodiment, but increased by 300. Thus, the transistor pair 400 comprises a substrate 405 and three III-nitride semiconductor layers 410, 415, 420. Eight electrodes 425n, 430n, 435n, 440n, 425p, 430p, 435p, 440p are formed on the semiconductor layers 410, 415, 420.

The electrodes are arranged such that one side 400n (the left-hand side as shown in FIG. 4) of the transistor pair 400 forms an enhancement mode n-channel transistor, and the other side 400p forms a p-channel transistor. A first gap 455 extends through the third layer 420 and the u-AlGaN layer 415, and separates the n-side 400n of those layers from the p-side 400p of them.

Referring first to the n-channel side 400n, the third layer 420 extends over some but not all of the u-AlGaN layer 415 on that side 400n, leaving first and second exposed upper surfaces 415a, 415b of the AlGaN layer 415—one at either end of the third layer 420. Two of the electrodes on the n-side 400n—a drain electrode 425n and a source electrode 435n—are provided on the exposed surfaces 415a, 415b. The drain electrode 425n and the source electrode 435n are formed from a metal with a work function that permits an ohmic connection to the 2DEG 445. The u-AlGaN layer 415 is thin enough to permit the source electrode 435n and the drain electrode 425n to be electrically connected to the 2DEG 445 by respective current paths 436n, 426n. Accordingly, the drain electrode 425n can be connected to the source electrode 435n via an n-channel A second gap 460 is etched down through the first exposed surface 415a of the u-AlGaN layer 415, and part way into the first u-GaN layer 410, on the n-channel side 400n. This provides an exposed surface 410b in the first u-GaN layer 410 and an exposed side wall 415d of the u-AlGaN layer 415 above that exposed surface 410b.

A gate electrode 430n is provided in, and extends through, the second gap 460. Thus the gate electrode 430n is positioned between the source electrode 435n and the drain electrode 425n on the n-side 400n, and extends through the 2DEG 435. The gate electrode 430n is a metal insulator semiconductor (MIS) gate, and so comprises a metal separated from the exposed surfaces 410b, 415 in the gap 460 by an insulating dielectric. In use, when a positive Vgs of magnitude above a threshold is applied, an 'enhancement' region is formed in the u-GaN layer 410 around the gate electrode 430n. In this condition an n-channel is formed along the 2DEG 445 via the enhancement region, connecting the drain electrode 425n to the source electrode 435n. Accordingly, the electrodes on the n-side 400n are arranged to provide an n-channel enhancement mode transistor. As described above the depth of the gate electrode can be varied to vary the threshold voltage, or to make the transistor a depletion mode transistor.

A further source electrode 440n is provided on the third layer 420. The further source electrode 440n is formed from a metal with a work function that permits ohmic connection to the 2DHG 450. The third layer 420 is thin enough to permit the further source electrode 440n to be electrically connected to the 2DHG 450. Accordingly, a SJ is formed which comprises the 2DEG and 2DHG. As such it reduces the peak electric strength between the gate and drain electrode, in a similar manner to the 2DHG transistor of FIG. 3.

Referring now to the p-channel side 400p shown in FIG. 4, two electrodes—a drain electrode 425p and a source electrode 435p—are provided on top of the third layer 420. The drain electrode 425p and the source electrode 435p are each formed from a metal with a work function that permits ohmic connection to the 2DHG 450. The third layer 420 is thin enough to permit the drain electrode 425p and the source electrode 435p to be electrically connected to the 2DHG 450 by respective current paths 426p, 436p. Accordingly, the drain electrode 425p can be electrically connected to the source electrode 435p via a p-channel along the 2DHG 450.

A third gap 465 is etched down through the third layer 420 on the p-side 400p, part way into the u-AlGaN layer 415. This provides a fourth exposed surface 415e on the u-AlGaN layer 415 and an exposed side wall 420a of the third layer 420 above that exposed surface 415e. A gate electrode 430p is provided in, and extends through, the third gap 465. Thus gate electrode 430p is positioned between the drain electrode 425p and the source electrode 435p, and extends through the 2DHG 450. Like the gate electrode 430n on the n-side 400n, the gate electrode 430p on the p-side 400p is a metal insulator semiconductor (MIS) gate. As was described with reference to the third embodiment, in use a p-channel can be formed along the 2DEG 445 part of which is formed around the gate electrode 430p, connecting the drain electrode 425p to the source electrode 435p. Accordingly, the electrodes on the p-side 400p are arranged to provide a p-channel enhancement mode transistor on the p-side 400p.

The third layer 420 extends over some but not all of the uAlGaN layer 415 on the p-side 400p, leaving a fifth exposed upper surface 415c of the uAlGaN layer 415 at the end opposite the end adjacent the first gap 455. A further source electrode 440p is provided on the fifth exposed surface 415b, and is formed from a metal with a work function that permits an ohmic connection to the 2DEG 445. The u-AlGaN layer 415 is thin enough to permit the further source electrode 440p to be electrically connected to the 2DEG 445. Accordingly, as was described with reference to the embodiment of FIG. 3, the further source electrode 440p connects to the 2DEG 445 thereby acting like a SJ comprising the 2DEG and 2DHG. As such it reduces the peak electric strength between the gate and drain electrode under certain conditions.

The respective drains 425p, 425n from the p- and n-sides 400p, 400n are connected together by a metal in the gap 465 to form a single mass which includes both drains. The combined drain electrodes 425n, 425p also fill a gap in the AlGaN layer 415 between the two devices, which ensures that there is a break in the 2DEG 445 between the two devices. In variants of this embodiment, however, they may be formed as physically separate electrodes that are subsequently connected together e.g. by a wire.

The respective gates 430p, 430n from the p- and n-sides 400p, 400n are connected together by a wire. However, they may be joined by metal to form as a single integrated electrode, or they may be controlled independently of each other.

In the final packaged device, the sources 430n, 435n on the n-side 400n will be electrically connected together, and the sources 430p, 435p on the p-side 400p will be electrically connected together.

The n-side 400n operates as an enhancement mode n-channel transistor, as will be appreciated from of its transfer characteristics. A enhancement mode n-channel transistor has a positive threshold voltage and therefore is a 'normally off' type of transistor i.e. when Vgs=0 no current flows between the drain and source electrodes 425, 435. When Vgs is increased to above the threshold voltage, a 2DEG is formed around the gate electrode such that current flows from the drain electrode 425 to the source electrode 435 via the n-channel formed by the enhancement region. Further increasing Vgs will increase the drain current until a saturation point is reached.

While both of the transistors of FIG. 4 are enhancement mode devices, either or both of them can be modified to be depletion mode devices with suitable re-arrangement of the gate electrode.

In a modification to this embodiment, the respective gates 430p, 430n on the p- and n-sides are instead formed on the third layer 420 and the u-AlGaN layer 415, respectively. The gates 430p, 430n are formed from a metal that permits a Schottky barrier connection to the 2DHG 450 and the 2DEG 445, respectively, so as to form depletion mode transistors instead of enhancement mode transistors. Alternatively, the plurality of electrodes may be provided in a different arrangement on the n-channel side 400n to form some other n-channel or 2DEG device.

FIFTH EMBODIMENT

Referring now to FIG. 5, a reverse conducting transistor (RCT) 500 according to one embodiment of the invention is made from a wafer having the structure described above with reference to the first embodiment. Corresponding wafer layers will be referred to in this embodiment by the reference numerals used in the first embodiment, but increased by 400. Thus, the RCT 500 comprises a substrate 505 and three III-nitride semiconductor layers 510, 515, 520. Five electrodes 525, 530, 535, 540, 542 are formed on the semiconductor layers 510, 515, 520.

The third layer 520 extends over some but not all of the u-AlGaN layer 515, leaving first and second exposed upper surfaces 515a, 515b of the u-AlGaN layer 515—one at either end. A first source electrode 535 is provided on the first exposed upper surface 515a, and a drain electrode 525 is provided on the second exposed upper surface 515b. The drain electrode 525 and the first source electrode 535 are formed from a metal with a work function that permits an ohmic connection to the 2DEG 545. The u-AlGaN layer 515 is thin enough to permit the drain electrode 525 and the first source electrode 535 to be electrically connected to the 2DEG 545 by respective current paths 525a, 535a. Accordingly, the drain electrode 525 is electrically connected to the first source electrode 535 by the 2DEG 245.

A gate electrode 530 and a second source electrode 540 are also provided on the first exposed upper surface 515a of the u-AlGaN layer 515. The gate electrode 530 and the second source electrode 540 are each made from a metal with a large work function which achieves a Schottky-barrier junction between it and the 2DEG 545.

The gate electrode 530 is positioned between the drain electrode 525 and first source electrode 535, and above the n-channel formed along the 2DEG 545. Therefore it is operable to affect the n-channel between the drain electrode 525 and first source electrode 535. Accordingly, the drain electrode 525, gate electrode 530 and first source electrode 535 electrodes are arranged to form a depletion mode n-channel (2DEG) transistor.

The second source electrode 540 is positioned between the gate electrode 530 and the drain electrode 525, and the u-AlGaN layer 515 is thin enough to permit the second source electrode 540 to be connected to the 2DEG 545 by a current path 540a (the direction of which is shown for positive current, which is the opposite direction to the flow of negative charge carriers). Therefore the gate electrode 530 has no significant affect on the 2DEG between the second source electrode 540 and the drain electrode 525. Accordingly the second source electrode 540 and drain electrode 525 electrodes are arranged to form a 2DEG Schottky barrier diode, the second source electrode 540 being the anode.

A third source electrode 542 is operatively provided on the third layer 520, at the end adjacent the first exposed upper surface. The third source electrode 542 is formed from a metal with a work function that permits an ohmic connection to the 2DHG 550 via a current path 542a. Accordingly, a SJ is formed which comprises the 2DEG and 2DHG. As such it reduces the peak electric strength between the gate and drain electrode.

Figure 5B:
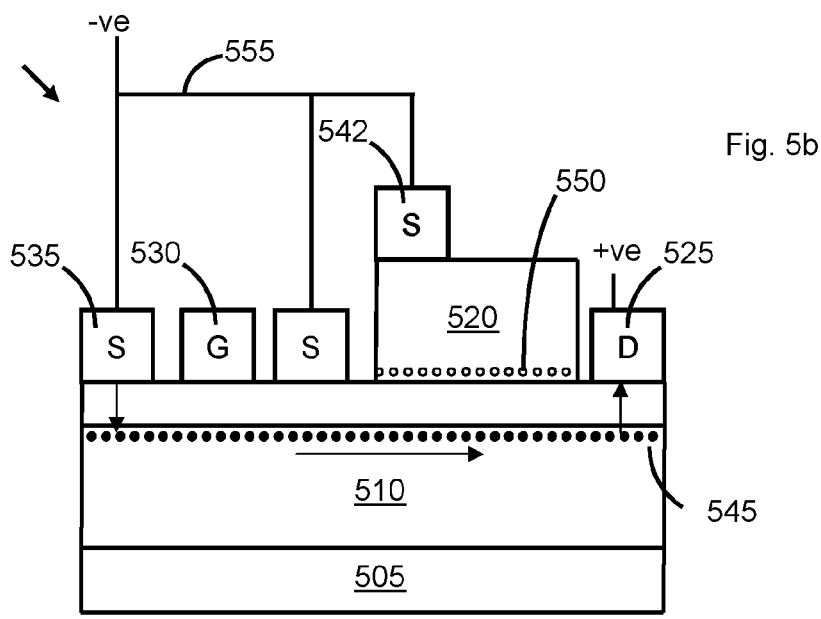
Figure 5C:
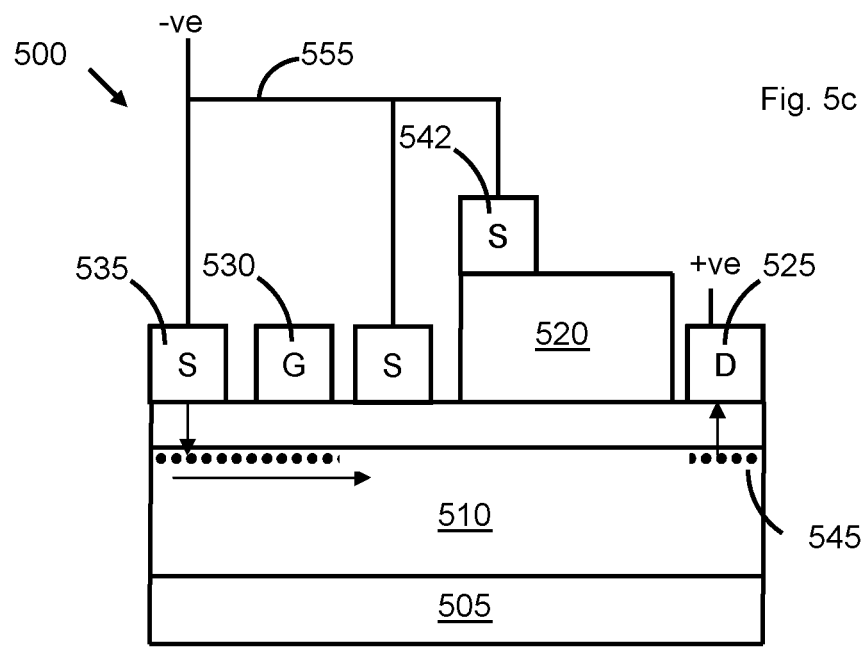
Figure 5D:
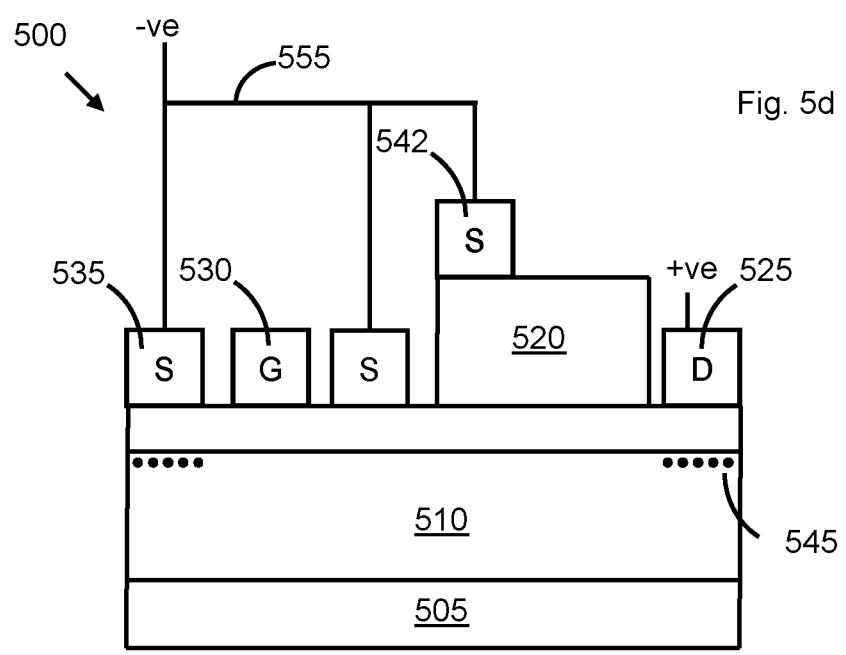

Referring to FIG. 5a, when Vds (i.e. the voltage applied to the drain with respect to the source) is positive, i.e. a forward bias voltage, the reverse conducting transistor 500 operates as a depletion mode n-channel transistor. A depletion mode n-channel transistor has a negative threshold voltage and therefore is a 'normally on' type of transistor i.e. when Vgs=0 negative charge carriers (electrons) flows from the drain electrode 525 to the first source electrode 535 as shown in FIG. 5b (which can be considered as a positive current flowing in the opposite direction), until it reaches saturation at which point charge balancing between the 2DEG and 2DHG limits further current increase as shown in FIG. 5c, up until a breakdown voltage is reached. Again the arrows in FIG. 5c, and in FIGS. 5e to 5g, show flow of charge carriers. Reducing Vgs from zero to a negative voltage of magnitude greater than the threshold voltage causes a depletion region around the gate electrode to expand so as to 'pinch off' the channel between the drain and first source electrodes 525, 535, thereby stopping the current between them. Increasing the bias voltage Vds causes depletion of the 2DEG and 2DHG by charge balancing as shown in FIG. 5d, so no current will flow until a very high breakdown voltage is reached.

When a reverse voltage is applied so that the potential of the drain with respect to the source, the drain-source voltage (Vds), is negative and when the gate is turned on it conducts via the 2DEG as shown in FIG. 5e. When the gate is turned off, the reverse conducting transistor 500 operates as a 2DEG SJ Schottky-barrier diode with its anode (the second source electrode 540) connected to the first source electrode 535 and the drain electrode 525 functioning as its cathode, as shown in FIG. 5f. When the magnitude of the negative Vds exceeds the threshold voltage of the Schottky-barrier junction at the second source electrode 540, current flows from the second source electrode 540 to the drain electrode 525 via the 2DEG 545 and the 2DHG.

In a modification to this embodiment the gate electrode can extend down through the GaN layer 515 into the AlGaN layer 510 so that the transistor is an enhancement mode transistor similar to that of FIG. 4.

SIXTH EMBODIMENT

Referring now to FIG. 6, a reverse conducting transistor (RCT) 600 according to a sixth embodiment of the invention is made from a wafer having the structure described above with reference to the first embodiment. Corresponding wafer layers will be referred to in this embodiment by the reference numerals used in the first embodiment, but increased by 500. Thus, the RCT 600 comprises a substrate 605 and three III-nitride semiconductor layers 610, 615, 620. Five electrodes 625, 630, 635, 640, 642 are formed on the semiconductor layers 610, 615, 620.

The third layer 620 extends over some but not all of the u-AlGaN layer 615, leaving first and second exposed upper surfaces 615a, 615b of the u-AlGaN layer 615—on opposite sides of the region in which the third layer 620 is present, one at either end of the RCT 600. A source electrode 635 is provided on the first exposed upper surface 615a, and a drain electrode 625 is provided on the second exposed upper surface 615b. The drain electrode 625 and the source electrode 635 are formed from a metal with a work function that permits an ohmic connection to the 2DEG 645 by respective current paths 625a, 635a. Accordingly, the drain electrode 625 is electrically connected to the source electrode 635 by the 2DEG 645.

A gate electrode 630 is also provided on the first exposed upper surface 615a between the source electrode 635 and the region in which the third layer 620 is present. The gate electrode 630 is made from a metal with a large work function which achieves a Schottky-barrier junction between it and the 2DEG 645. The gate electrode 630 is positioned between the drain electrode 625 and the source electrode 635, above the 2DEG 645. The gate electrode 630 is therefore operable to affect the n-channel formed along the 2DEG 645, which connects the drain electrode 625 to the source electrode 635. Accordingly, the drain electrode 625, gate electrode 630 and source electrode 635 electrodes are arranged to form a depletion mode 2DEG transistor 600.

A further source electrode 640 and a further drain electrode 642 are provided on the third layer 620, at its ends adjacent the first and second exposed upper surfaces 615a, 615b respectively, and electrically connected to the source electrode 635 and the drain electrode 625 respectively. The further source electrode 640 is formed from a metal with a work function that permits an ohmic connection to the 2DHG 650. The further drain electrode 642 is made from a metal with a small work function which produces a Schottky-barrier junction between it and the 2DHG 650. The further source electrode 640 and the further drain electrode 642 are electrically connected to the 2DHG 650 by respective currents paths 640a, 642a. The gate electrode 630 is operable to affect the 2DEG 645 but not the 2DHG 650. Accordingly, the 2DHG 650 connects the further source electrode 640 to the further drain electrode 642, which form a 2DHG Schottky barrier diode in which the further source electrode 640 acts as the anode.

When Vds (i.e. the voltage applied to the drain with respect to the source) is positive the reverse conducting transistor 600 operates as a depletion mode n-channel transistor, substantially as was described above with reference to the fifth embodiment.

When Vds is negative and the gate electrode is at a potential to prevent conduction via the 2DEG the reverse conducting transistor 600 operates as a reverse-coupled 2DHG Schottky-barrier diode. When the magnitude of Vds exceeds the threshold voltage of the diode, current flows from the further source electrode 640 to the further drain electrode 642 via the 2DHG 650, first in a unipolar mode, then in a bipolar mode when the voltage increases above a threshold, as in FIG. 5a. In other states, the device operates as a 2DEG d-mode transistor in the same way as the device of FIG. 5.

SEVENTH EMBODIMENT

Referring now to FIG. 7, a reverse conducting transistor (RCT) 700 according to a seventh embodiment of the invention is made from a wafer having the structure described above with reference to the first embodiment. Corresponding wafer layers will be referred to in this embodiment by the reference numerals used in the first embodiment, but increased by 600. Thus, the RCT 700 comprises a substrate 705 and three III-nitride semiconductor layers 710, 715, 720. Five electrodes 725, 730, 735, 740, 742 are formed on the semiconductor layers 710, 715, 720.

The third layer 720 extends over some but not all of the u-AlGaN layer 715, leaving first and second exposed upper surfaces 615a, 615b of the u-AlGaN layer 715—one at either end. A source electrode 735 is provided on the first exposed upper surface 715a, and a drain electrode 725 is provided on the second exposed upper surface 715b.

The source electrode 735 is formed from a metal with a work function that permits an ohmic connection to the 2DEG 745. The drain electrode 725 is formed from a metal with a large work function which achieves a Schottky-barrier junction between it and the 2DEG 745. The u-AlGaN layer 715 is thin enough to permit the drain electrode 725 and the source electrode 735 to be electrically connected to the 2DEG 745 by respective current paths 725a, 735a. Accordingly, the 2DEG 745 electrically connects the drain electrode 725 to the source electrode 735, which form a 2DEG Schottky barrier diode in which the drain electrode 725 is the anode.

A further source electrode 740 and a further drain electrode 742 are provided on the third layer 720, at the ends adjacent the first and second exposed upper surfaces 715a, 715b respectively. In the fully packaged RCT the two sources 735, 740 are electrically connected together, and the two drains 725, 742 are electrically connected together. A gate electrode 730 is provided on the third layer 720 between the further source electrode 740 and the further drain electrode 742.

The further source electrode 740 and the further drain electrode 742 are each formed from a metal with a work function that permits an ohmic connection to the 2DHG 750. The further source electrode 740 and the further drain electrode 742 are electrically connected to the 2DHG 750 by respective current paths 740a, 742a. Accordingly, the 2DHG 750 connects the further source electrode 740 to the further drain electrode 742.

The gate electrode 730 is made from a metal with a small work function which achieves a Schottky-barrier junction between it and the 2DHG 750. The gate electrode 730 is positioned between the further source electrode 740 and the further drain electrode 742, above the 2DHG 750. The gate electrode 730 is therefore operable to affect the 2DHG 750, which connects the further source electrode 740 to the further drain electrode 742, but to have no significant affect on the 2DEG 750. Accordingly, the drain electrode 725, gate electrode 730 and source electrodes 735, 740 are arranged to form a depletion mode 2DHG transistor 700, which operates like that of FIG. 2. The additional electrode 725 forms a SBD under reverse bias voltage.

Referring to FIG. 7a, parts (b), (c), (d), (e), and (f) are the same as those parts in FIG. 2a as the device operates as that of FIG. 2. However, when Vds is positive the reverse conducting transistor 700 operates as a 2DEG Schottky-barrier diode. When the magnitude of Vds exceeds the threshold voltage of the diode, current flows from the drain electrode 725 to the source electrode 735 in unipolar manner via the 2DEG 745, as shown at (f) in FIG. 7a. When a threshold voltage is reached current starts to flow via the 2DEG and 2DHG in a bipolar manner as shown at (g) in FIG. 7a.

EIGHTH EMBODIMENT

Referring now to FIG. 8, a reverse conducting transistor (RCT) 800 according to an eighth embodiment of the invention is made from a wafer having the structure described above with reference to the first embodiment. Corresponding wafer layers will be referred to in this embodiment by the reference numerals used in the first embodiment, but increased by 700. Thus, the RCT 800 comprises a substrate 805 and three III-nitride semiconductor layers 810, 815, 820. Five electrodes 825, 830, 835, 840, 842 are formed on the semiconductor layers 810, 815, 820.

A drain electrode 825, a gate electrode 830 and first and second source electrodes 835, 840 are provided on the third layer 820. The second source electrode 840 is provided at one end of the third layer 820, and the drain electrode 825 is provided at the opposite end. The second source electrode 840 and the drain electrode 825 are each formed from a metal with a work function that permits an ohmic connection to the 2DHG 850. The third layer 820 is thin enough to permit the second source electrode 840 and the drain electrode 825 to be electrically connected to the 2DHG 850. Accordingly, the 2DHG 850 connects the second source electrode 840 to the drain electrode 825.

The gate electrode 830 is provided between the drain electrode 825 and the second source electrode 840. The gate electrode 830 is made from a metal with a small work function which achieves a Schottky-barrier junction between it and the 2DHG 850. The gate electrode 830 is positioned between the second source electrode 840 and the drain electrode 825, above the 2DHG 850. The gate electrode 830 is therefore operable to affect the p-channel formed along the 2DHG 850, which connects the second source electrode 840 to the drain electrode 825. Accordingly, the drain electrode 825, the gate electrode 830 and the second source electrode 840 are arranged to form a depletion mode p-channel transistor 800.

The first source electrode 835 is provided between the gate electrode 830 and the drain electrode 825. The first source electrode 835 is formed from a metal with a small work function which achieves a Schottky-barrier junction between it and the 2DHG 850. The third layer 820 is thin enough to permit the first source electrode 835 to be electrically connected to the 2DHG 850. Accordingly, the 2DHG 850 electrically connects the drain electrode 825 to the first source electrode 835, which form a p-channel Schottky barrier diode in which the first source electrode 835 is the anode.

The third layer 820 extends over some but not all of the u-AlGaN layer 815, leaving an exposed upper surface 815a of the u-AlGaN layer. A third source electrode 842 is provided on the exposed surface 815a. In the fully packaged RCT the three sources 835, 840, 842 are connected together e.g. by a wire 855. The third source electrode 842 is formed from a metal with a work function that permits an ohmic connection to the 2DEG 845. Accordingly, substantially as was described with reference to the third embodiment, a SJ comprises the 2DEG and 2DHG. As such it reduces the peak electric strength between the gate and drain electrode.

Under most conditions this device acts like the devices of FIG. 7, operating as a 2DHG d-mode transistor. However, when Vds is positive the reverse conducting transistor 800 operates as a p-channel Schottky-barrier diode. When the magnitude of Vds exceeds the threshold voltage of the diode, current flows from the drain electrode 825 to the first source electrode 835 via the 2DHG 850.

NINTH EMBODIMENT

Referring now to FIG. 9, a bidirectional transistor (BT) 900 according to an ninth embodiment of the invention is made from a wafer having the structure described above with reference to the first embodiment. Corresponding wafer layers will be referred to in this embodiment by the reference numerals used in the first embodiment, but increased by 800. Thus, the BT 900 comprises a substrate 905 and three III-nitride semiconductor layers 910, 915, 920. Five electrodes 925, 930, 935, 940, 942 are formed on the semiconductor layers 910, 915, 920.

A gate electrode 930 and first and second source electrodes 940, 942 are provided on top of the third layer 920. Both source electrodes 940, 942 are formed from a metal with a work function that permits an ohmic connection to the 2DHG 950

The gate electrode 930 is located between the two source electrodes 940, 942 and is formed from a metal with a work function that achieves a Schottky barrier junction between it and the 2DHG 950.

The third layer 920 extends over some but not all of the u-AlGaN layer 915, leaving respective exposed surfaces 915a, 915b of the u-AlGaN layer 915 at either end of the BT 900. First and second further gate electrodes 925, 935 are provided on the u-AlGaN layer 915, one on each of the exposed surfaces 915a, 915b. The two further gate electrodes 925, 935 are electrically connected to the gate 930.

Both further gate electrodes 925, 935 are formed from a metal with a work function that permits an ohmic connection to the 2DEG 945, and the u-AlGaN layer 915 is thin enough to permit them to be connected to the 2DEG 945 via respective current paths 925a, 935a. The 2DEG 945 extends in a continuous layer beneath the gate electrode 930 and both source electrodes 940, 942.

The voltage between the two source electrodes 940, 942 can be arranged such that current flows either way between them through the 2DHG, under control of the gate voltage applied to the gate, with the more positive source electrode acting as the source and the more negative source electrode acting as the drain. As this s a D-mode device a positive voltage Vgs applied to the gate electrode 930 (relative to the source) turns the transistor off, whichever way the current is flowing through it. When the positive gate voltage is applied, the two further gate electrodes 925, 935 will also be positive with respect to the source which will deplete the 2DEG and hence also the 2DHG, thereby increasing the breakdown voltage of the device.

MODIFICATIONS & OTHER EMBODIMENTS

Devices in accordance with the invention may be formed from various wafers suitable for inducing an n-channel, e.g. a 2DEG, and/or a p-channel e.g. a 2DHG. For example, one suitable wafer structure comprises four III-nitride semiconductor layers grown on a sapphire substrate. The bottom two layers are a u-GaN layer beneath an u-AlGaN (x=0.226)

layer, at approximately 1000 nm thick and approximately 47 nm thick respectively. The third layer 120, 220, 320 in the embodiments described above is replaced by two layers: a u-GaN lower layer and a p-type GaN (p-GaN) upper layer. The u-GaN lower layer is approximately 10 nm thick, and the p-GaN upper layer is approximately 30 nm thick and is doped with Magnesium (Mg) at a doping density of approximately 3e19 cm-3.

In one suitable variant of this example structure, an Indium Gallium Nitride (InGaN) layer and a Mg doped InGaN layer replace the top two layers. In another variant, an InGaN layer replaces the bottom layer. Many more suitable variants will be apparent to those skilled in the art.

The fifth, sixth, seventh and eighth embodiments comprise respective reverse conducting transistors which include a depletion mode transistor and a Schottky barrier diode. Persons skilled in the art will be appreciate that, in variations of those embodiments, an enhancement mode transistor could replace the depletion mode transistor and a PN junction diode could replace the Schottky barrier diode where applicable. Such variations are considered to fall within the scope of the invention.

In the embodiments comprising a depletion mode and enhancement mode transistors, the gate electrode has been described as being formed from a metal which permits a Schottky barrier junction to a 2DHG or a 2DEG. In variations of those embodiments, the gate electrode may instead be a MIS gate. Indeed in all embodiments where a Schottky barrier gate electrode is described, a MIS electrode can be used instead.

In the embodiments, an undoped Gallium Nitride layer is provided directly onto the substrate. It will be clear to the skilled person may put a initial layer, e.g. an Aluminium Nitride buffer layer, between the undoped Gallium Nitride layer and the substrate.

Whereas the embodiments described above include group III nitrides, other materials which show spontaneous polarization and therefore can form the 2DEG and 2DHG can also be used. Suitable semiconductors include other III-V semiconductors, II-VI semiconductors, and organic (polymer) semiconductors such as PVDF, poly(vinylidene fluoride). Examples of II-VI semiconductors are ZnO and MgZnO.

In many of the embodiments described above two of the electrodes are connected together, such as the two cathode electrodes of FIG. 1. It will be clear to the skilled may that in each case the electrodes do not need to be connected together and can be controlled independently, either to produce the same results, or to allow more flexibility in the way the device is controlled.

Whereas the wafer structures, and the embodiments of the invention made from it, have been described with layers in one order, it will be appreciated that the layers could be formed in a different order. For example, the layers could be formed so that a 2DHG is induced beneath a 2DEG, instead of above it.

The skilled person will appreciate that features from one described embodiment can, where appropriate, be included in another described embodiment. Some of the features are optional and could be removed altogether.

The invention claimed is:

1. A semiconductor device comprising:
   three semiconductor layers;
   wherein the semiconductor layers are formed of at least one of a group III nitride semiconductor, zinc oxide and magnesium zinc oxide and arranged to form a 2DHG, a 2DEG and a polarization layer which separates the 2DHG and the 2DEG,
   a plurality of electrodes comprising:
   first and second electrodes electrically connected to the 2DHG so that current can flow between them via the 2DHG; and
   a third electrode electrically connected to the 2DEG so that when a positive voltage is applied to the third electrode, with respect to at least one of the other electrodes, the 2DEG and the 2DHG will be at least partially depleted.

2. A device according to claim 1 wherein one of the semiconductor layers is between the other two semiconductor layers and forms the polarization layer, an interface is formed between the polarization layer and each of the other two semiconductor layers, the 2DHG is formed at the interface between the polarization layer and a first one of the other semiconductor layers, and the 2DEG is formed at the interface between the polarization layer and a second one of the other of the semiconductor layers.

3. A device according to claim 1 wherein the first and second electrodes are a cathode and an anode respectively, one of which is arranged to form a Schottky barrier between it and the semiconductor layer it is connected to so that current can flow from the anode to the cathode.

4. A device according to claim 3 wherein the cathode is arranged to form the Schottky barrier and is connected to the third electrode.

5. A semiconductor transistor comprising:
   three semiconductor layers;
   wherein the semiconductor layers are arranged to form a 2DHG, a 2DEG and a polarization layer which separates the 2DHG and the 2DEG,
   a plurality of electrodes comprising:
   first and second electrodes electrically connected to the 2DHG so that current can flow between them via the 2DHG; and
   a third electrode electrically connected to the 2DEG so that when a positive voltage is applied to the third electrode, with respect to at least one of the other electrodes, the 2DEG and the 2DHG will be at least partially depleted wherein:
   the plurality of electrodes comprises a source electrode, a gate electrode and a drain electrode each connected to one of the semiconductor layers so that a current can flow between the source electrode and the drain electrode;
   the source electrode and the drain electrode are connected to the 2DHG; and
   the gate electrode is operable to vary the current between the source electrode and the drain electrode.

6. A device according to claim 5 wherein the source electrode is connected to the 2DHG and is also connected to the 2DEG via the third electrode.

7. A device according to claim 5 wherein the transistor is an enhancement mode transistor.

8. A device according to claim 5 wherein the transistor is a depletion mode transistor.

9. A device according to claim 1 comprising a second plurality of electrodes, the second plurality comprising first and second electrodes each connected to one of the semiconductor layers, wherein the first electrode of the second plurality is connected to the second electrode of the second plurality via the 2DEG.

10. A device according to claim 9 wherein the second plurality of electrodes comprises an anode and a cathode each connected to one of the semiconductor layers, one of which is arranged to form a Schottky barrier between it and the semiconductor layer it is connected to, wherein the anode of the second plurality is connected to the cathode of the second plurality via the 2DEG so as to produce a Schottky barrier diode.

11. A device according to claim 10 wherein the anode of the second plurality is arranged to form the Schottky barrier and is connected to the 2DHG and to the 2DEG.

12. A device according to claim 11 comprising a transistor wherein:
the plurality of electrodes comprises a source electrode, a gate electrode and a drain electrode each connected to one of the semiconductor layers so that a current can flow between the source electrode and the drain electrode;
the source electrode and the drain electrode are connected to the 2DHG; and
the gate electrode is operable to vary the current between the source electrode and the drain electrode, and
wherein the anode is connected to the drain electrode and the cathode is connected to the source electrode.

13. A device according to claim 9 comprising a transistor wherein:
the second plurality of electrodes comprises a source electrode, a gate electrode and a drain electrode each connected to one of the layers;
the source electrode of the second plurality is connected to the drain electrode of the second plurality via the 2DEG; and
the gate electrode of the second plurality is operable to vary the current between the source electrode and the drain electrode of the second plurality.

14. A device according to claim 13 wherein the transistor is an enhancement mode transistor.

15. A device according to claim 13 wherein the transistor is a depletion mode transistor, the gate electrode of the second plurality being supported over the 2DEG.

16. A semiconductor device according to claim 13 comprising a transistor wherein:
the plurality of electrodes comprises a source electrode, a gate electrode and a drain electrode each connected to one of the semiconductor layers so that a current can flow between the source electrode and the drain electrode;
the source electrode and the drain electrode are connected to the 2DHG; and
the gate electrode is operable to vary the current between the source electrode and the drain electrode, and
wherein the drain electrode of the first plurality and the drain electrode of the second plurality are connected together, the gate electrode of the first plurality and the gate electrode of the second plurality are connected together.

17. A semiconductor device according to claim 9 comprising a reverse conducting transistor wherein the second plurality of electrodes form a Schottky barrier diode.

18. A semiconductor device comprising:
three semiconductor layers;
wherein the semiconductor layers are arranged to form a 2DHG, a 2DEG and a polarization layer which separates the 2DHG and the 2DEG;
a first plurality of electrodes comprising:
first and second electrodes electrically connected to the 2DHG so that current can flow between them via the 2DHG; and
a third electrode electrically connected to the 2DEG so that when a positive voltage is applied to the third electrode, with respect to at least one of the other electrodes, the 2DEG and the 2DHG will be at least partially depleted;
wherein the first and second electrodes are a cathode and an anode respectively, one of which is arranged to form a Schottky barrier between it and the semiconductor layer it is connected to so that current can flow from the anode to the cathode; and
a transistor formed from a second plurality of electrodes comprising a source electrode, a gate electrode and a drain electrode each connected to one of the semiconductor layers so that a current can flow between the source electrode and the drain electrode;
the source electrode and the drain electrode are connected to the 2DHG so that current can flow between them via the 2DHG; and
the gate electrode is operable to vary the current between the source electrode and the drain electrode;
wherein the cathode is connected to the source electrode and the anode is connected to the drain electrode thereby to form a reverse conducting transistor.

19. A semiconductor device comprising:
three semiconductor layers;
wherein the semiconductor layers are arranged to form a 2DHG, a 2DEG and a polarization layer which separates the 2DHG and the 2DEG;
first and second transistors each comprising:
a source electrode, a gate electrode and a drain electrode each connected to one of the semiconductor layers so that a current can flow between the source electrode and the drain electrode;
the source electrode and the drain electrode are connected to the 2DHG; and
the gate electrode is operable to vary the current between the source electrode and the drain electrode
wherein the drain electrode of the first transistor is connected to the drain electrode of the second transistor to form a bi-directional transistor.

20. A reverse conducting transistor comprising:
three semiconductor layers;
wherein the semiconductor layers are arranged to form a 2DHG and a 2DEG separated by a polarization layer,
a plurality of electrodes comprising:
a source electrode and a drain electrode arranged such that a current can flow between them via at least one of the 2DEG and the 2DHG, a gate electrode arranged to vary the current flowing between the source and drain electrodes, and a further electrode arranged to form a Schottky barrier diode with one of the layers to provide a reverse conducting path.

21. A bi-directional transistor comprising:
three semiconductor layers;
wherein the semiconductor layers are arranged to form a 2DHG and a 2DEG separated by a polarization layer,
a plurality of electrodes comprising:
a first source and a second source arranged such that a current can flow in either direction between them via at least one of the 2DEG and the 2DHG, and at least one gate electrode arranged to vary the current.

22. A bi-directional transistor comprising:
three semiconductor layers;
wherein the semiconductor layers are arranged to form a 2DHG and a 2DEG separated by a polarization layer,
a plurality of electrodes comprising:
three electrodes comprising two source-drain pairs, each of the pairs being connected together via one of the 2DEG and the 2DHG so that current can flow between the two electrodes of the pair, and two gate electrodes each arranged to vary the current flowing between the electrodes in a respective one of the pairs.

* * * * *